United States Patent
Hosotani

(10) Patent No.: US 7,046,545 B2
(45) Date of Patent: May 16, 2006

(54) SEMICONDUCTOR INTEGRATED CIRCUIT DEVICE INCLUDING MAGNETORESISTIVE EFFECT DEVICE AND METHOD OF MANUFACTURING THE SAME

(75) Inventor: Keiji Hosotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 10/635,605

(22) Filed: Aug. 7, 2003

(65) Prior Publication Data

US 2004/0095813 A1 May 20, 2004

(30) Foreign Application Priority Data

Aug. 7, 2002 (JP) ............... 2002-230126

(51) Int. Cl.
*G11C 11/02* (2006.01)
*H01L 21/00* (2006.01)

(52) U.S. Cl. .......................................... 365/158; 438/3
(58) Field of Classification Search ................... 438/3; 257/44–46, 295; 365/1, 2, 23, 29, 30, 32, 365/33, 34, 51, 158

See application file for complete search history.

(56) References Cited

U.S. PATENT DOCUMENTS

| | | | |
|---|---|---|---|
| 5,838,608 A * | 11/1998 | Zhu et al. | 365/158 |
| 6,498,747 B1 * | 12/2002 | Gogl et al. | 365/158 |
| 6,707,084 B1 * | 3/2004 | Katti et al. | 257/295 |
| 6,816,402 B1 * | 11/2004 | Deak | 365/158 |
| 2001/0035545 A1 * | 11/2001 | Schuster-Woldan et al. | 257/296 |
| 2002/0018361 A1 * | 2/2002 | Hoffmann et al. | 365/158 |
| 2004/0191928 A1 * | 9/2004 | Shi | 438/3 |

FOREIGN PATENT DOCUMENTS

JP 2000-76842 3/2000

* cited by examiner

*Primary Examiner*—Evan Pert
(74) *Attorney, Agent, or Firm*—Oblon, Spivak, McClelland, Maier & Neustadt, P.C.

(57) ABSTRACT

A semiconductor integrated circuit device includes a first wiring extending in a first direction, a second wiring extending in a second direction crossing the first direction, and a TMR device including a first magnetic layer, a nonmagnetic layer, and a second magnetic layer. The planar shape of the TMR device coincides with the planar shape of the crossing portion between the first wiring and the second wiring.

14 Claims, 30 Drawing Sheets

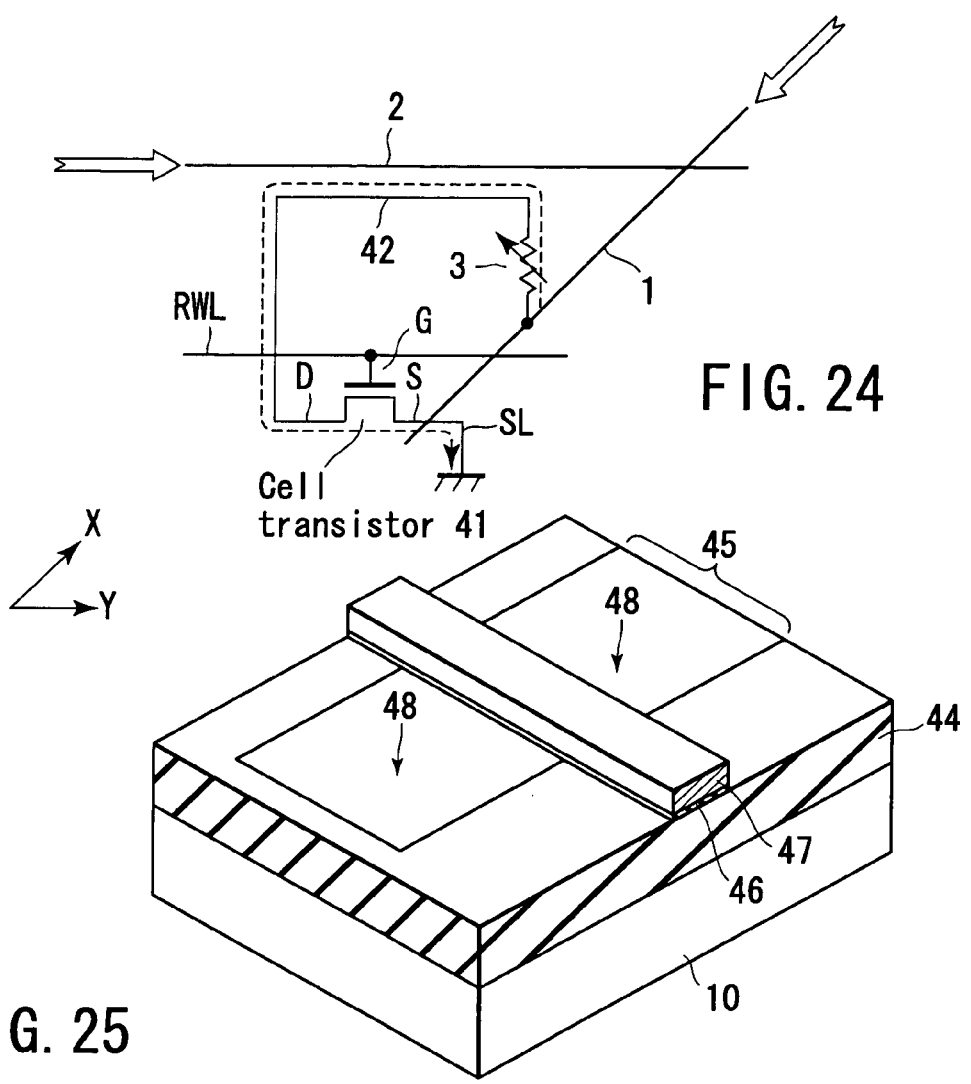
FIG. 24
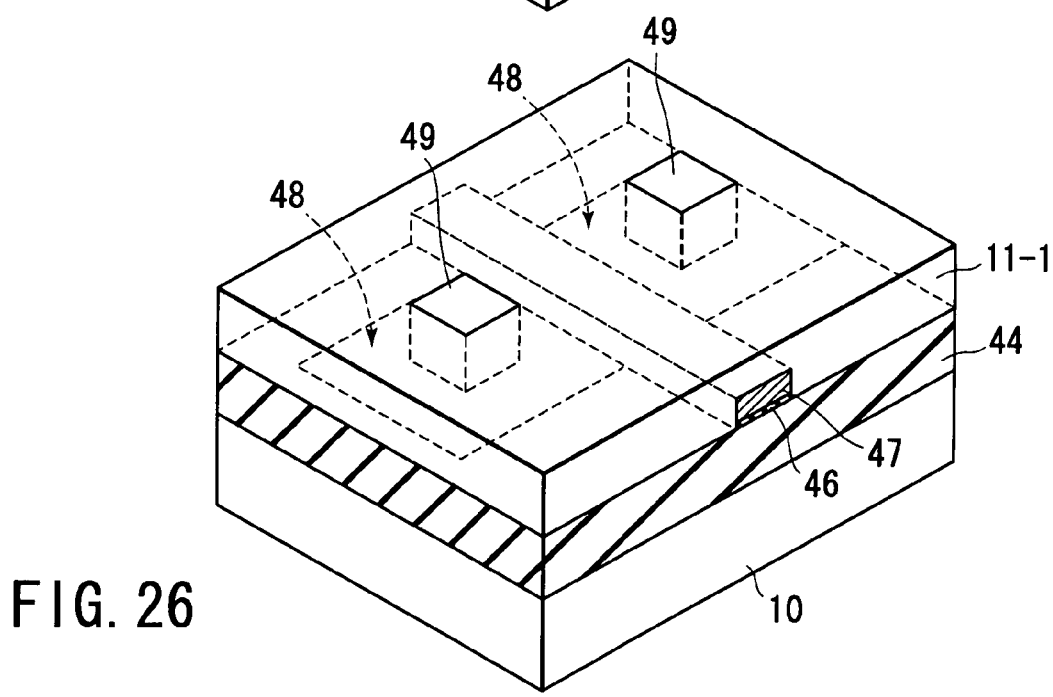
FIG. 25
FIG. 26

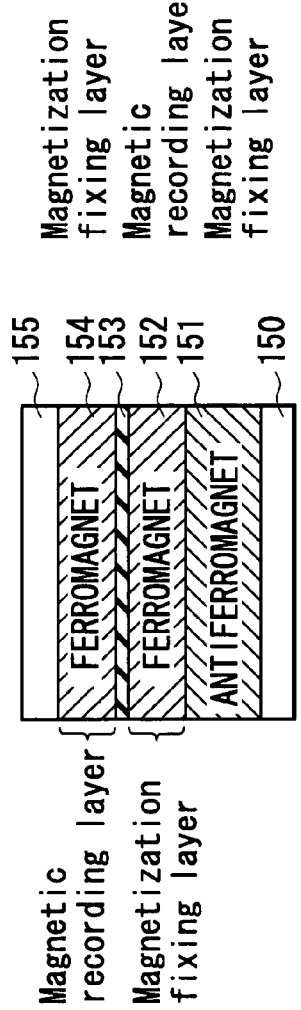
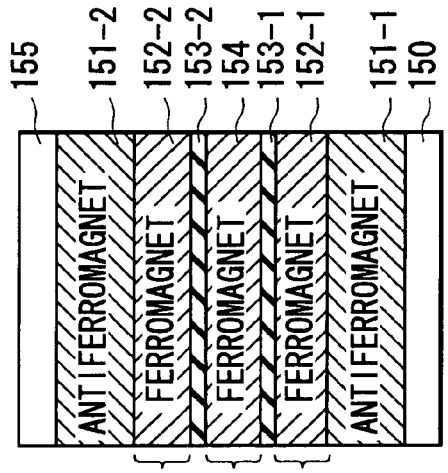
FIG. 40A
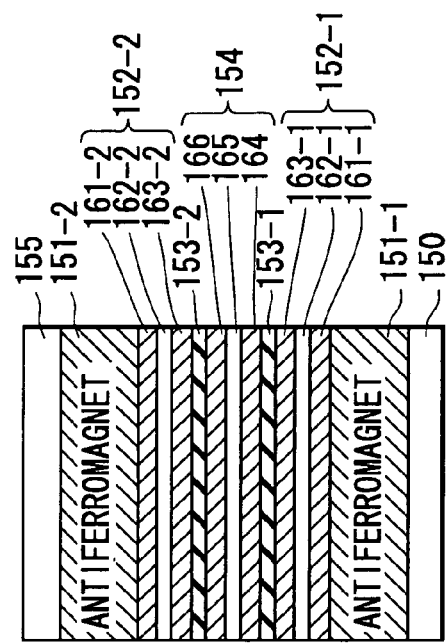
FIG. 40B
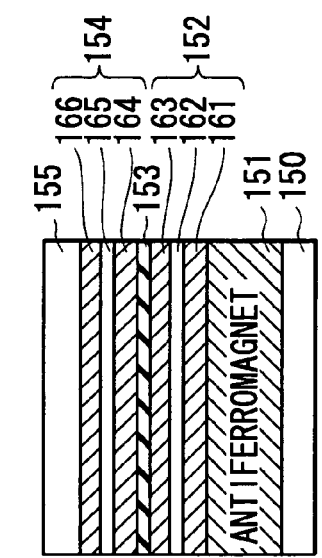
FIG. 40C
FIG. 40D

Transfer first MRAM data to write control section

Ideal MTJ shape

Ideal MTJ shape

Actual MTJ shape

SEMICONDUCTOR INTEGRATED CIRCUIT DEVICE INCLUDING MAGNETORESISTIVE EFFECT DEVICE AND METHOD OF MANUFACTURING THE SAME

CROSS-REFERENCE TO RELATED APPLICATIONS

This application is based upon and claims the benefit of priority from the prior Japanese Patent Application No. 2002-230126, filed Aug. 7, 2002, the entire contents of which are incorporated herein by reference.

BACKGROUND OF THE INVENTION

1. Field of the Invention

The present invention relates to a semiconductor integrated circuit device and a method of manufacturing the same, particularly to a semiconductor integrated circuit device having a memory cell including a magnetoresistive effect device and a method of manufacturing the semiconductor integrated circuit device.

2. Description of the Related Art

A magnetoresistive random access memory (hereafter referred to as MRAM) is one of memories for writing or reading data by electricity or magnetism.

FIG. 48A is a top view showing a typical MRAM, FIG. 48B is a sectional view taken along the line 48B—48B in FIG. 48A, and FIG. 48C is a sectional view taken along the line 48C—48C in FIG. 48A.

As shown in FIGS. 48A to 48C, there are a first galvanomagnetic-field wiring 101 extending in the first direction X and a second galvanomagnetic-field wiring 102 extending in the second direction Y crossing the first direction X. A magnetoresistive effect device 103 is set to the crossing portion between the first galvanomagnetic-field wiring 101 and the second galvanomagnetic-field wiring 102. A TMR device including magnetic tunnel junction (Tunneling MagnetoResistive; hereafter referred to as TMR) is generally used for the magnetoresistive effect device 103. The magnetoresistive effect device 103 is hereafter referred to as a TMR device 103.

The TMR device 103 is selected by selecting the first and second galvanomagnetic-field wirings 101 and 102 one each and thereby, data is read from or written in the TMR device 103 of an optional bit. Specifically, data is read by selecting a pair of first and second galvanomagnetic-field wirings 101 and 102 and detecting the magnitude of the current circulating between the selected first and second galvanomagnetic-field wirings 101 and 102.

Moreover, data is written by selecting a pair of first and second galvanomagnetic-field wirings 101 and 102 and supplying a current between the selected first and second galvanomagnetic-field wirings 101 and 102. Furthermore, by using the fact that a magnetic field generated by the current becomes strong at the crossing portion between the selected first and second galvanomagnetic-field wirings 101 and 102, data is written in the TMR device 103 located at the crossing portion.

In the case of a typical MRAM, the width WY-WL of the first galvanomagnetic-field wiring 101 is larger than the width WY-TMR along the second direction Y of the TMR device 103 and the width WX-BL of the second galvanomagnetic-field wiring 102 is larger than the width WX-TMR along the first direction X of the TMR 103. This is because the TMR device 103 is worked through the photolithography. In the case of the photolithography, misalignment of a mask occurs. The value of misalignment is approx. tens of nanometers at present.

To work the TMR 103 so that it is not shifted from the crossing portion between the first galvanomagnetic-field wiring 101 and the second galvanomagnetic-field wiring 102, it is necessary to add an alignment allowance MY considering a displacement of the TMR device 103 to the width WY-WL. Similarly, an alignment allowance MX is added to the width WX-BL.

The above condition causes a trouble when forming a larger memory by reducing the cell size of the MRAM for one bit.

Moreover, a magnetization reversal threshold value Hsw is one of device parameters of the MRAM. The magnetization reversal threshold value Hsw is the intensity of a magnetic field when reversal of the direction of the spin of a ferromagnetic material is started and one of parameters for deciding the intensity of a magnetic field to be applied to the TMR device 103 when data is written.

When the fluctuation band of the magnetization reversal threshold value Hsw is too large, data may be erroneously written. The magnetization reversal threshold value Hsw is fluctuated depending on the shape of the TMR device 103. Therefore, to manufacture the MRAM, it is important to control the magnetization reversal threshold value Hsw, particularly to minimize the fluctuation band of the magnetization reversal threshold value Hsw.

Moreover, it is preferable that the magnetization reversal threshold value Hsw is minimized. When the magnetization reversal threshold value Hsw is minimized, there are advantages that the current necessary for data writing can be decreased and the power consumption of, for example, an MRAM chip can be decreased. Furthermore, decrease of the current necessary for data writing is advantageous for circuit design of the MRAM chip because the influence of a galvanomagnetic field and the influence relating to a withstand voltage are decreased.

The rectangle shown in FIG. 49A is ideal as a planar shape of the TMR device 103. However, when the TMR device 103 is further fined, four corners of the TMR device 103 are actually rounded as shown in FIG. 49B and further approach to an ellipse as shown in FIG. 49C. One of the causes is that an isolated island-shaped pattern is formed through, for instance, photolithography every TMR device 103.

Because the planar shape of the TMR device 103 is deviated from an ideal shape, the magnetization reversal threshold value Hsw rises. Moreover, because the planar shape of the TMR device 103 is greatly fluctuated, it is difficult to decrease the fluctuation band of the magnetization reversal threshold value Hsw.

BRIEF SUMMARY OF THE INVENTION

A semiconductor integrated circuit device according to a first aspect of the present invention comprises: a first wiring extending in a first direction; a second wiring extending in a second direction crossing the first direction; and a magnetoresistive effect device including a first magnetic layer, nonmagnetic layer, and second magnetic layer, wherein the planar shape of the magnetoresistive effect device coincides with the planar shape of the crossing portion between the first wiring and the second wiring.

A semiconductor integrated circuit device according to a second aspect of the present invention comprises: a first wiring extending in a first direction; a second wiring extending in a second direction crossing the first direction; and a magnetoresistive effect device including a first magnetic layer, nonmagnetic layer, and second magnetic layer, wherein the magnetoresistive effect device is a magnetoresistive effect device constituted by a magnetic recording layer including a magnetic layer, a tunnel blocking layer including a nonmagnetic layer, and a magnetized fixed layer including a magnetic layer, wherein the planar shape of the magnetic recording layer coincides with the planar shape of the crossing portion between the first wiring and the second wiring and the planar shape of the magnetized fixed layer coincides with the planar shape of the first wiring.

A method of manufacturing a semiconductor integrated circuit device according to a third aspect of the present invention comprises: forming a first insulating layer on a semiconductor substrate; forming a first conductive layer on the first insulating layer; forming a magnetoresistive effect device layer including at least a first magnetic layer, nonmagnetic layer, and second magnetic layer on the first conductive layer; working the magnetoresistive effect device layer and the first conductive layer by using a mask corresponding to a first wiring pattern; forming a second insulating layer on the worked magnetoresistive effect device layer and the first insulating layer; planarizing the second insulating layer so that the upper face of the second insulating layer and the upper face of the magnetoresistive effect device layer are exposed on the same plane; forming a second conductive layer on the second insulating layer and the magnetoresistive effect device layer; and working the second conductive layer and the magnetoresistive effect device layer by using a mask having a pattern corresponding to a second wiring pattern.

A method of manufacturing a semiconductor integrated circuit device according to a fourth aspect of the present invention comprises: forming a first insulating layer on a semiconductor substrate; forming a first conductive layer on the first insulating layer; forming a composite layer including a rectifying device layer and a magnetoresistive effect device layer formed by at least a first magnetic layer, nonmagnetic layer, and second magnetic layer on the first conductive layer; working the composite layer and the first conductive layer by using a mask having a pattern corresponding to a first wiring pattern; forming a second insulating layer on the first pattern and the first insulating layer; planarizing the second insulating layer so that the upper face of the second insulating layer and the upper face of the composite layer are exposed on the same plane; forming a second conductive layer on the second insulating layer and the composite layer; and working the second conductive layer and the composite layer by using a mask having a pattern corresponding to a second wiring pattern.

A method of manufacturing a semiconductor integrated circuit device according to a fifth aspect of the present invention comprises: forming a first insulating layer on a semiconductor substrate; forming a first conductive layer on the first insulating layer; forming a magnetoresistive effect device layer including at least a first magnetic layer, nonmagnetic layer, and second magnetic layer on the first conductive layer; working the magnetoresistive effect device layer and the first conductive layer by using a mask having a pattern corresponding to a first wiring pattern; forming a second insulating layer on the worked magnetoresistive effect device layer and the first insulating layer; planarizing the second insulating layer so that the upper face of the second insulating layer and the upper face of the magnetoresistive effect device layer are exposed on the same plane; forming a second conductive layer on the second insulating layer and the magnetoresistive effect device layer; forming a third insulating layer on the third insulating layer; forming a third conductive layer on the second conductive layer; and working the third conductive layer, the third insulating layer, the second conductive layer, and the magnetoresistive effect device layer by using a mask having a pattern corresponding to a second wiring pattern.

A method of manufacturing a semiconductor integrated circuit device according to a sixth aspect of the present invention comprises: forming a first insulating layer on a semiconductor substrate; forming a first conductive layer on the first insulating layer; forming a composite layer including a rectifying device layer and a magnetoresistive effect device layer formed by at least a first magnetic layer, nonmagnetic layer, and second magnetic layer on the first conductive layer; working the composite layer and the first conductive layer by using a mask having a pattern corresponding to a first wiring pattern; forming a second insulating layer on the worked composite layer and the first insulating layer; planarizing the second insulating layer so that the upper face of the second insulating layer and the upper face of the composite layer are exposed on the same plane; forming a second conductive layer on the second insulating layer and the magnetoresistive effect device layer; forming a third insulating layer on the second conductive layer; forming a third conductive layer on the third insulating layer; and working the third conductive layer, the third insulating layer, the second conductive layer, and the composite layer by using a mask having a pattern corresponding to a second wiring pattern.

A method of manufacturing a semiconductor integrated circuit device according to a seventh aspect of the present invention comprises: forming a first insulating layer on a semiconductor substrate on which an insulating-gate-type field-effect transistor is formed; planarizing the first insulating layer; forming a first conductive layer on the first insulating layer; forming a magnetoresistive effect device layer including at least a first magnetic layer, nonmagnetic layer, and second magnetic layer on the first conductively layer; working the magnetoresistive effect device layer and the first conductive layer by using a mask having a pattern corresponding to a first wiring pattern; forming a second insulating layer on the worked magnetoresistive effect device layer and the first insulating layer; planarizing the second insulating layer so that the upper face of the second insulating layer and the upper face of the magnetoresistive effect device layer are exposed on the same plane; forming a via to be electrically connected to the source or drain of the insulating-gate-type field-effect transistor by penetrating the second insulating layer and the first insulating layer; forming a second conductive layer on the second insulating layer and the magnetoresistive effect device layer; working the second conductive layer into a pattern contacting with the magnetoresistive effect device and the via; forming a third insulating layer on the worked second conductive layer and the second insulating layer; forming a third conductive layer on the third insulating layer; and working the third conductive layer, the third insulating layer, the second conductive layer, and the magnetoresistive effect device layer by using a mask having a pattern corresponding to a second wiring pattern.

BRIEF DESCRIPTION OF THE SEVERAL VIEWS OF THE DRAWING

FIG. 24 is an equivalent circuit diagram of the MRAM of the fourth embodiment of the present invention;

FIG. 25 is a perspective view showing a method of manufacturing the MRAM of the fourth embodiment of the present invention;

FIG. 26 is a perspective view showing a method of manufacturing the MRAM of the fourth embodiment of the present invention;

FIG. 40A is a sectional view showing a first TMR device;

FIG. 40B is a sectional view showing a second TMR device;

FIG. 40C is a sectional view showing a third TMR device;

FIG. 40D is a sectional view showing a fourth TMR device;

DETAILED DESCRIPTION OF THE INVENTION

Embodiments of the present invention are described below by referring to the accompanying drawings. In every drawing to be explained, common portions are provided with a common reference symbol.

(First Embodiment)

Figure 1A:
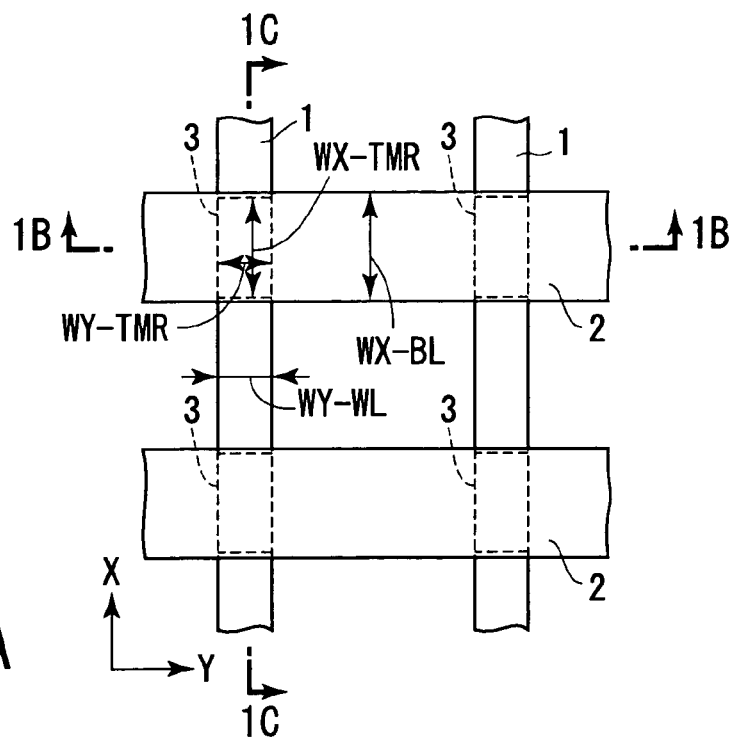
FIG. 1A is a top view showing an MRAM of a first embodiment of the present invention.
Figure 1B:
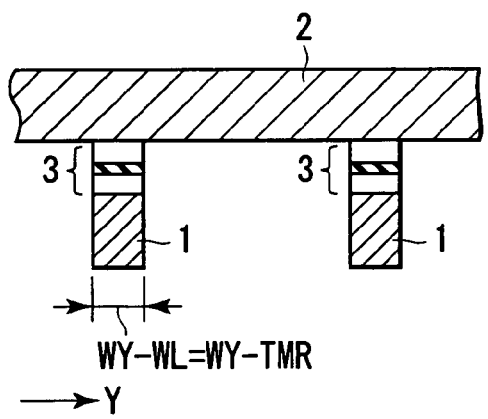
FIG. 1B is a sectional view taken along the line 1B—1B in FIG. 1A.
Figure 1C:
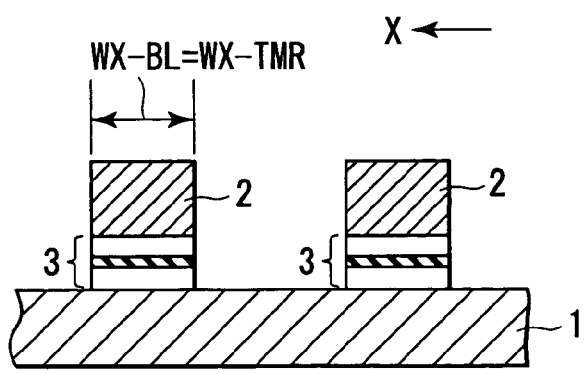
FIG. 1C is a sectional view taken along the line 1C—1C in FIG. 1A.

FIG. 1A is a top view showing the MRAM (MRAM) of the first embodiment of the present invention, FIG. 1B is a sectional view taken along the line 1B—1B in FIG. 1A, and FIG. 1C is a sectional view taken along the line 1C—1C in FIG. 1A.

As shown in FIGS. 1A to 1C, the MRAM of the first embodiment has the first galvanomagnetic-field wiring 1 extending in the first direction X and the second galvanomagnetic-field wiring 2 extending in the second direction Y which crosses with or is orthogonal to the first direction X. The TMR 3 is set to each crossing portion between the first and second galvanomagnetic-field wirings 1 and 2 to constitute a memory cell array. In the case of this embodiment, the planar shape of the TMR device 3 coincides with the planar shape of the above crossing portion. The TMR device 3 is one of TMR devices respectively including TMR (Tunneling Magneto-Resistive). A TMR device includes a magnetic recording layer including a magnetic layer such as a ferromagnetic layer, a tunnel blocking layer including a nonmagnetic layer, and a magnetized fixed layer including a magnetic layer such as a ferromagnetic layer.

The MRAM shown in FIGS. 1A to 1C is the MRAM referred to as the cross point type in which the first galvanomagnetic-field wiring 1 is present on the lower face of the TMR device 3 and a contact with the second galvanomagnetic-field wiring 2 is present on the upper face of the device 3. In the case of this embodiment, the first galvanomagnetic-field wiring 1 functions as a read/write word line (which may be referred to as a digit line) and the second galvanomagnetic-field wiring 2 functions as a bit line. It is naturally possible to make the first galvanomagnetic-field wiring 1 function as a bit line and the second galvanomagnetic-field wiring 2 function as a read/write word line.

The TMR 3 is selected by selecting the first and second galvanomagnetic-field wirings 1 and 2 one each and thereby, data is read from or written in the TMR device 3 of any bit. Specifically, data is read by selecting a pair of first and second galvanomagnetic-field wiring 1 and 2 and detecting the magnitude of the current circulating between the selected first and second galvanomagnetic-field wirings 1 and 2. When data is read, a read current also circulates through a not-selected cell. The current is referred to as a leakage current. To restrain the leakage current and improve the read signal margin such as an S/N ratio at the time of read, it is also allowed to adjust non-selected potentials of galvanomagnetic-field wirings 1 and 2 and restrain the current circulating through not-selected first and second galvanomagnetic-field wirings 1 and 2.

Moreover, data is written by selecting a pair of first and second galvanomagnetic-field wirings 1 and 2 and supplying a current to the selected first and second galvanomagnetic-field wirings 1 and 2. Then, by using the fact that a magnetic field generated by the current becomes strong at the crossing portion between the selected first and second galvanomagnetic-field wirings 1 and 2, data is written in the TMR device 3.

Then, a method of manufacturing the MRAM of the first embodiment of the present invention is described below.

FIGS. 2 to 7 are perspective views showing a method of manufacturing the MRAM of the first embodiment of the present invention.

Figure 2:
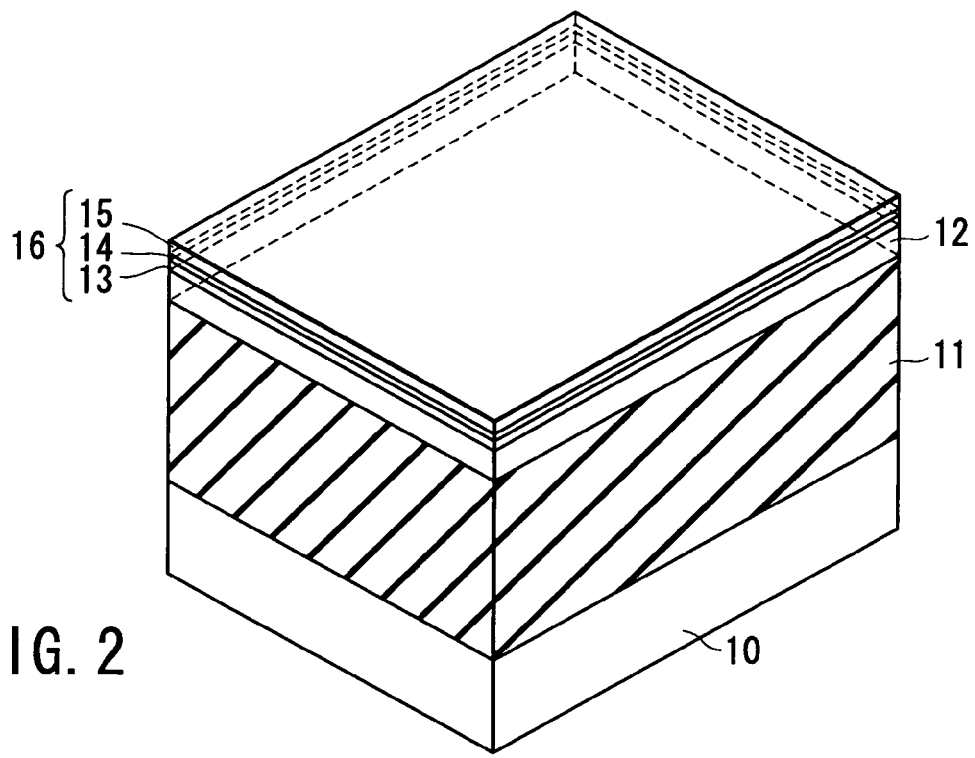
FIG. 2 is a perspective view showing a method of manufacturing the MRAM of the first embodiment of the present invention.

First, as shown in FIG. 2, a first insulating layer 11 is formed on a semiconductor substrate such as a silicon substrate 10. The first insulating layer 11 uses a silicon oxide film as one of materials. A plurality of insulating-gate field-effect transistors formed by using the normal CMOS process such as MOSFETs are formed on the substrate 10 to constitute various functional circuits. The MOSFETs are not illustrated. Then, the surface of the first insulating layer 11 is flattened through CMP so as to absorb steps formed due to the MOSFETs. Then, a first conductive layer 12 is formed on the first insulating layer 11. The first conductive layer 12 is a layer serving as the first galvanomagnetic-field wiring 1, which uses Al as one of materials. Then, a TMR-device layer 16 including at least a first magnetic layer 13, nonmagnetic layer 14, and second magnetic layer 15 is formed on the first conductive layer 12. The first magnetic layer 13 is a layer serving as a magnetized fixed layer in the case of this embodiment, which uses, for example, a ferromagnetic material. NiFe is one of ferromagnetic materials. The nonmagnetic layer 14 is a layer serving as a tunnel blocking layer which uses, for example, a nonmagnetic material. $Al_2O_3$ is used as one of nonmagnetic materials. The second magnetic layer 15 is a layer serving as a magnetic recording layer of this embodiment, which uses a ferromagnetic material. NiFe is one of ferromagnetic materials.

Figure 3:
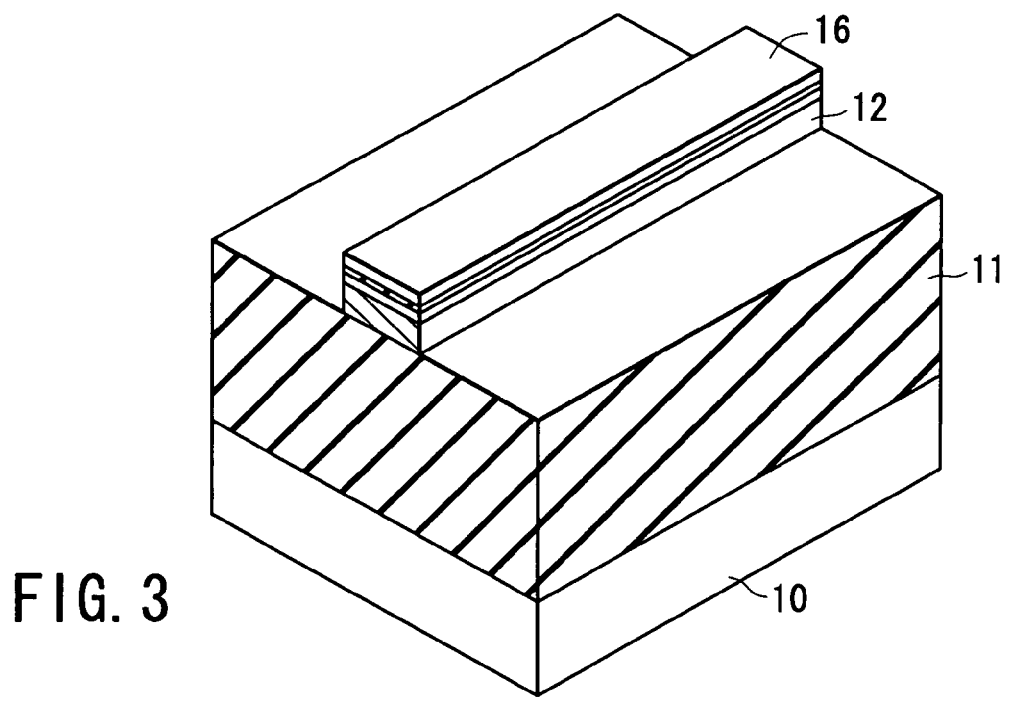
FIG. 3 is a perspective view showing a method of manufacturing the MRAM of the first embodiment of the present invention.

Then, as shown in FIG. 3, the TMR-device layer 16 and first conductive layer 12 are worked by using a mask having a pattern corresponding to a first galvanomagnetic-wiring pattern. First, a hard mask layer (not illustrated) is formed on the TMR-device layer 16. Then, a photoresist layer (not illustrated) is formed on the hard mask layer. Then, the photoresist layer is formed into a pattern corresponding to a first galvanomagnetic-field wiring pattern through normal photolithography. Then, the formed photoresist-layer pattern is transferred through RIE, that is, the hard mask layer is patterned in accordance with the photoresist-layer pattern. Then, for the patterned hard mask layer, the TMR-device layer 16 and first conductive layer 12 are etched by using an etching mask through, for example, ion milling using Ar gas.

Figure 4:
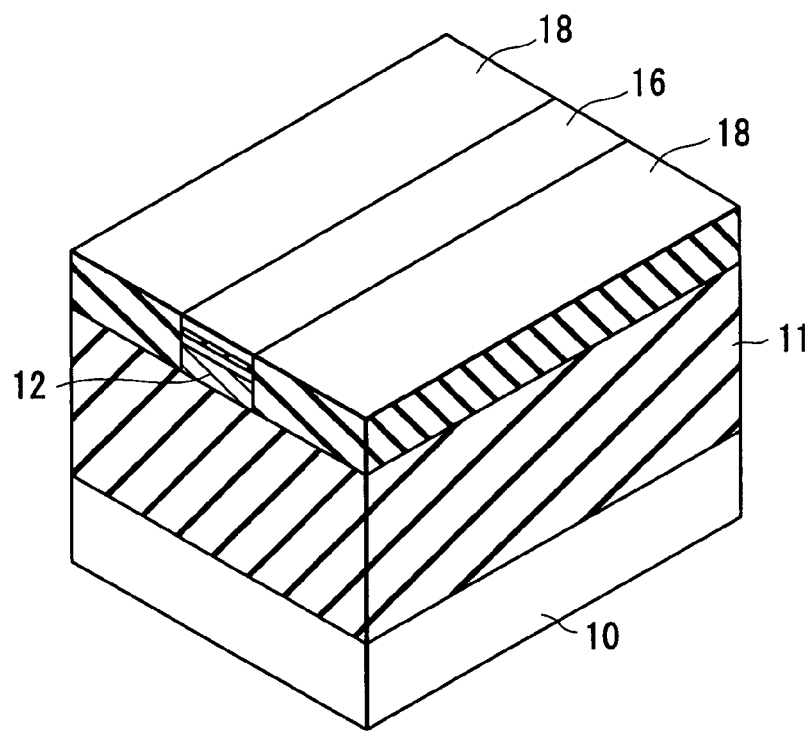
FIG. 4 is a perspective view showing a method of manufacturing the MRAM of the first embodiment of the present invention.

Then, as shown in FIG. 4, a second insulating layer 18 is formed on the TMR-device layer 16 and first insulating layer 11. Then, the second insulating layer 18 is flattened in accordance with, for example, the CMP method so that the upper face of the layer 18 and the upper layer of the TMR-device layer 16 are exposed on the same plane. When planarizing the layer 18, by using the hard mask layer as a CMP stopper layer, it is possible to obtain an advantage that the damage by CMP is not directly added to the TMR-device layer 16. When using a conductive material for the hard mask layer, it is possible to leave the hard mask layer after flattened. The left hard mask layer can be effectively used as a contact material between the second galvanomagnetic-field wiring and the TMR-device layer 16. When using a insulating material for the hard mask layer, the hard mask layer is removed after flattened.

Figure 5:
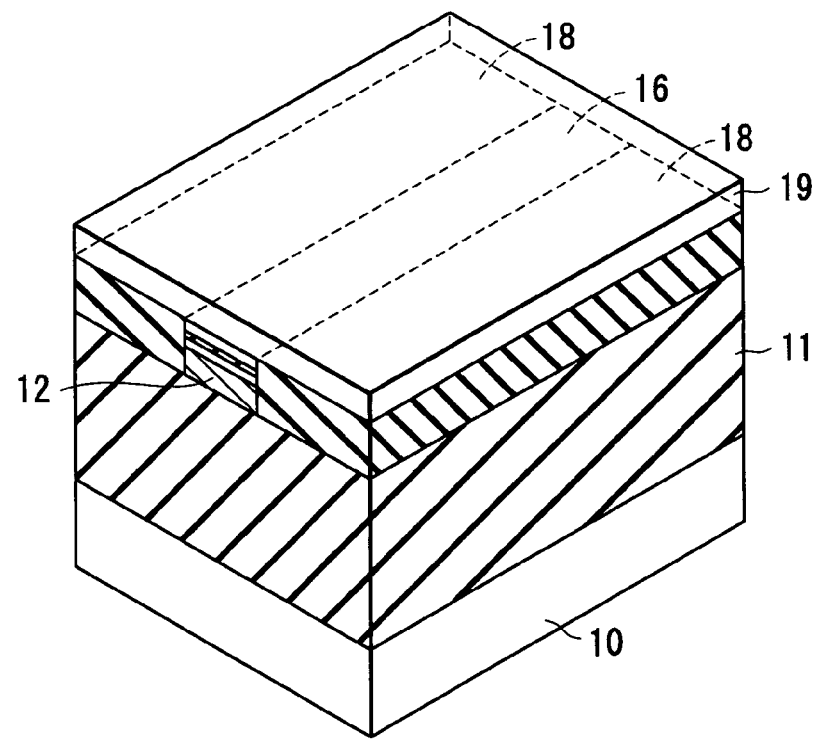
FIG. 5 is a perspective view showing a method of manufacturing the MRAM of the first embodiment of the present invention.

Then, as shown in FIG. 5, a second conductive layer 19 is formed on the second insulating layer 18 and TMR-device layer 16. The second conductive layer 19 is a layer serving as the first galvanomagnetic-field wiring 2, which uses Al as one of materials.

Figure 6:
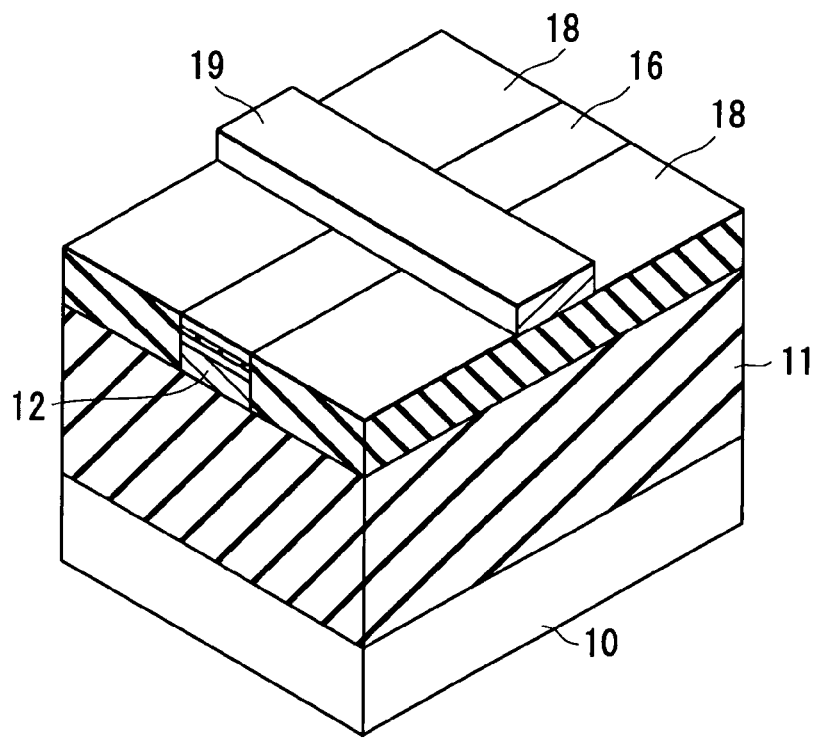
FIG. 6 is a perspective view showing a method of manufacturing the MRAM of the first embodiment of the present invention.
Figure 7:
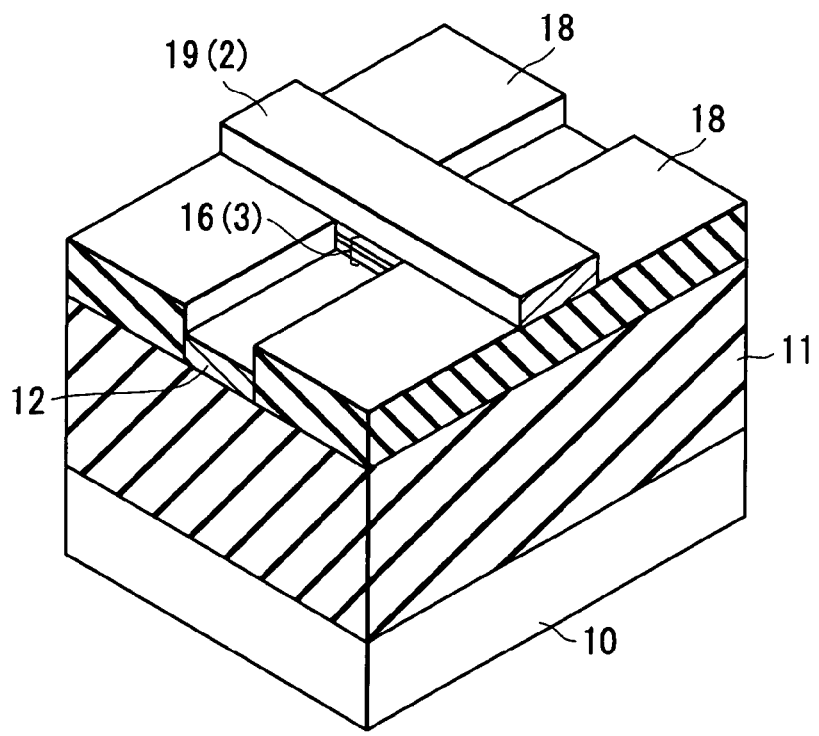
FIG. 7 is a perspective view showing a method of manufacturing the MRAM of the first embodiment of the present invention.

Then, as shown in FIGS. 6 and 7, the second conductive layer 19 and TMR-device layer 16 are worked by using a mask having a pattern corresponding to a second galvanomagnetic-wiring pattern. For example, a photoresist layer is worked into a pattern corresponding to the second galvanomagnetic-wiring pattern through normal photolithography. Then, the pattern of the worked photoresist layer is patterned by using an etching mask and thereby adjusting the second conductive layer 18 to the pattern of the photoresist layer. Then, the TMR-device layer 16 is worked by using the photoresist layer and the worked second conductive layer 19 as etching masks. Thereby, the second conductive layer 19 serves as the second galvanomagnetic-field wiring 2 and the first conductive layer 12 serves as the first galvanomagnetic-field wiring 1. Then, the TMR device 3 having a flat shape coinciding with the planar shape of the crossing portion between the first galvanomagnetic-field wiring 1 and second galvanomagnetic-field wiring 2 is obtained at the crossing portion.

Finally, a memory cell array portion of the MRAM of the first embodiment is finished by forming a third insulating layer on the structure shown in FIG. 6.

In the case of the first embodiment, the planar shape of the TMR 3 coincides with the planar shape of the crossing portion between the first galvanomagnetic-field wiring 1 and the second galvanomagnetic-field wiring 2. It is possible to form the planar shape of the crossing portion into a rectangle. Therefore, it is possible to decrease the magnetization reversal threshold value Hsw compared to the case of a TMR device whose four corners are rounded or a TMR device whose flat shape becomes elliptic.

Moreover, to work the TMR device 3, the pattern of the second galvanomagnetic-field wiring 2 is used for an etching mask. Therefore, it is not necessary to form an isolated fine island-shaped pattern every TMR device 3. Furthermore, the pattern of the second galvanomagnetic-field wiring 2 is a line-and-space pattern having less shape fluctuation than the fine island-shaped pattern. Therefore, it is possible to decrease the fluctuation of the planar shape of the TMR device 3 and prevent the fluctuation band of a magnetization reversal threshold value from expanding.

Moreover, it is not necessary to add an alignment allowance to the width of the first galvanomagnetic-field wiring 1 and that of the second galvanomagnetic-field wiring 2. In the case of this embodiment, the width WY-TMR along the second direction Y of the TMR device 3 is equal to the width WY-WL along the second direction Y of the first galvanomagnetic-field wiring 1. The width WX-TMR along the first direction X of the TMR device 3 is equal to the width WX-BL along the first direction X of the second galvanomagnetic-field wiring 2. Therefore, it is possible to further raise the density of a cell layout or further decrease a sell size.

Moreover, it is possible to omit a photolithography step for the TMR device 3. Therefore, an advantage that a manufacturing process can be abbreviated is also obtained.

(Second Embodiment)

Figure 8A:
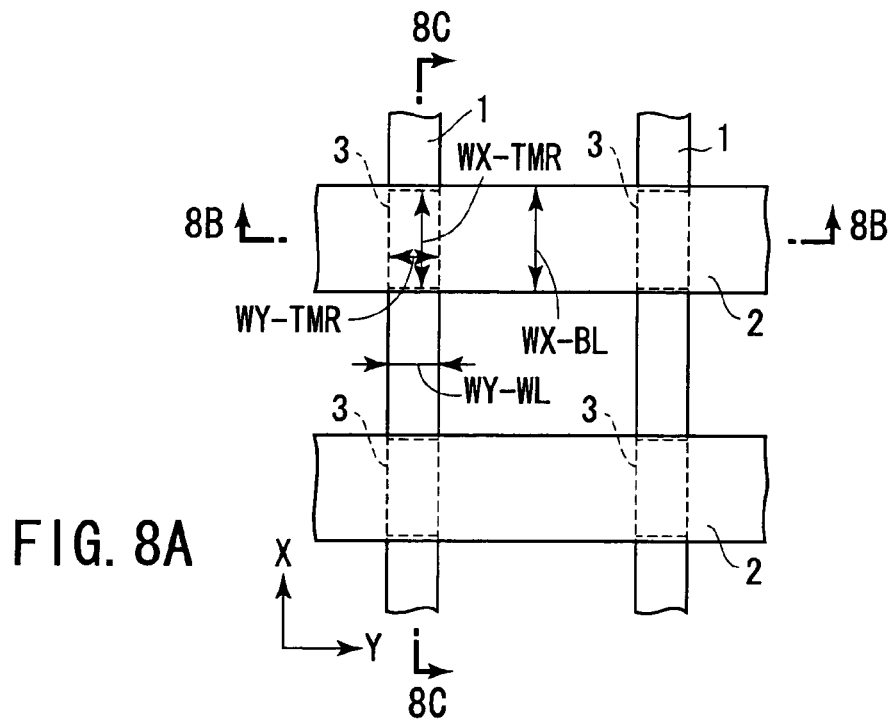
FIG. 8A is a top view showing the MRAM of a second embodiment of the present invention.
Figure 8B:
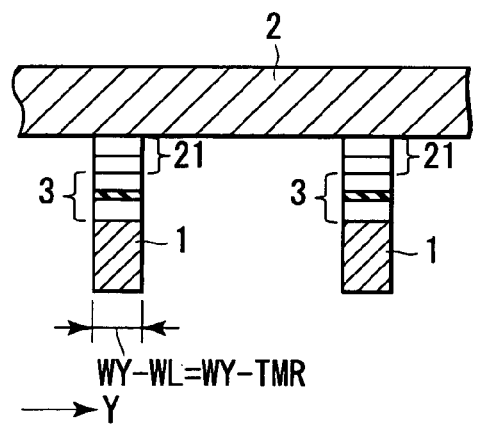
FIG. 8B is a sectional view taken along the line 8B—8B in FIG. 8A.
Figure 8C:
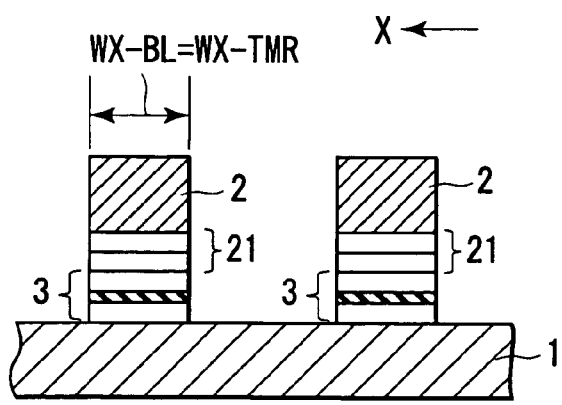
FIG. 8C is a sectional view taken along the line 8C—8C in FIG. 8A.

FIG. 8A is a top view showing an MRAM of the second embodiment of the present invention, FIG. 8B is a sectional view taken along the line 8B—8B in FIG. 8A, and FIG. 8C is a sectional view taken along the line 8C—8C in FIG. 8A.

As shown in FIGS. 8A to 8C, the MRAM of the second embodiment is constituted by forming a rectifying device 21 on the TMR device 3 of the MRAM of the above first embodiment. The rectifying device 21 is connected to the TMR device 3 in series. The rectifying device 21 and TMR device 3 connected in series are connected between a first galvanomagnetic-field wiring 1 and a second galvanomagnetic-field wiring 2. The rectifying device 21 has a function for writing data in only a selected cell or reading data from only a selected cell by supplying current to the cell.

Moreover, by using the rectifying device 21, it is also possible to restrain the current to be supplied to a not-selected cell when reading data. Thereby, in the case of the MRAM referred to as the cross point type, it is possible to improve the a read signal margin such as an S/N ratio at the time of read. Thereby, the reliability of the read operation is improved and it is possible to accelerate the read operation.

Figure 9A:
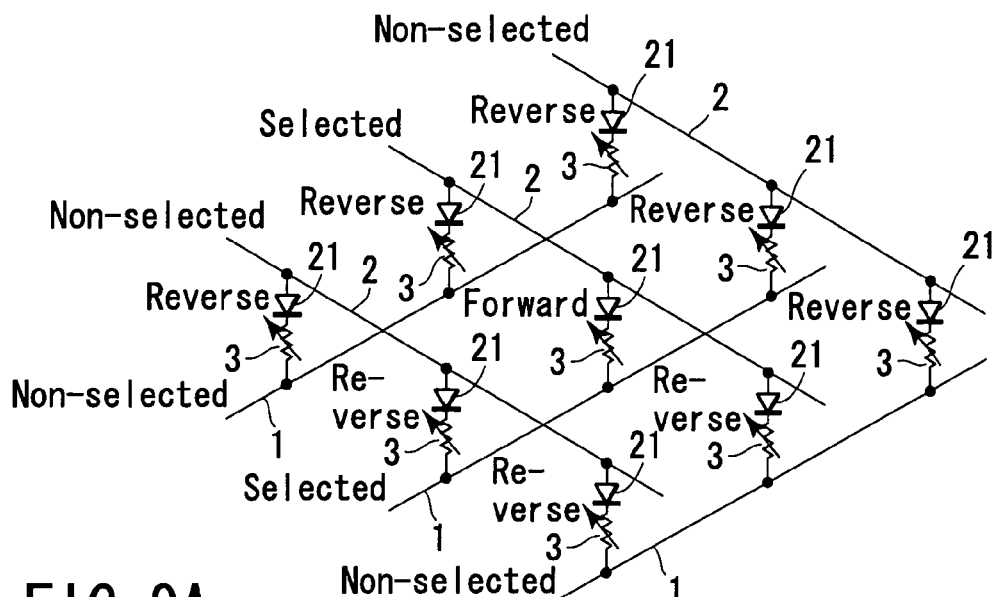
FIG. 9A is an equivalent circuit diagram of a memory cell array of the MRAM of the second embodiment of the present invention.

As a specific case, it is possible to control biases of not-selected first and second galvanomagnetic-field wirings 1 and 2 so that biases other than those of selected cells serve as reverse biases by using the rectifying property of the rectifying device 21 as shown in FIG. 9A. Thereby, it is possible to restrain the leakage current circulating through not-selected cell. A diode is one of rectifying devices 21. Moreover, a Schottky diode is one of diodes.

Figure 9B:
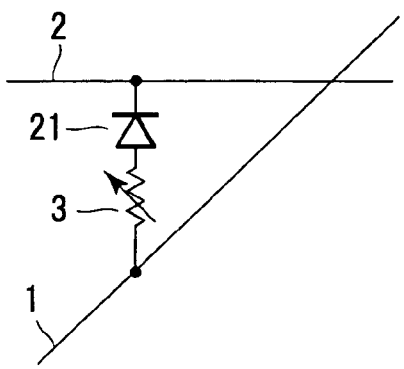
FIG. 9B is an equivalent circuit diagram of a first modification of the second embodiment.

Furthermore, it is allowed to set the anode of the rectifying device 21 to the TMR device-3 side as shown in FIG. 9B.

Figure 9D:
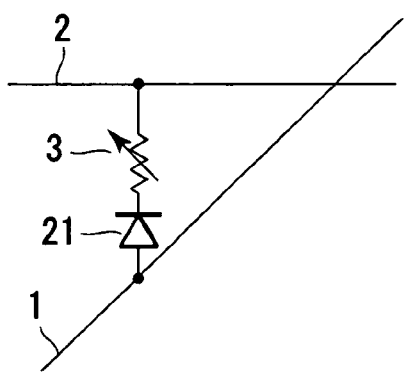
FIG. 9D is an equivalent circuit diagram of a third modification of the second embodiment.
Figure 9C:
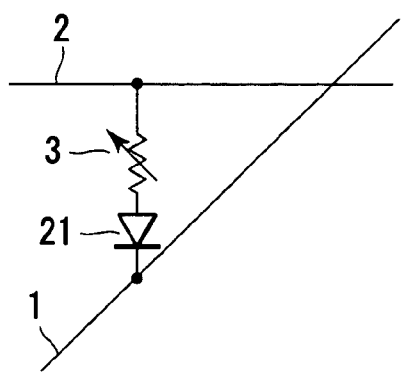
FIG. 9C is an equivalent circuit diagram of a second modification of the second embodiment.

Moreover, it is allowed to set the rectifying device 21 between the TMR device-3 and first galvanomagnetic-field wirings 1 as shown in FIGS. 9C and 9D.

Then, a method of manufacturing the MRAM of the second embodiment of the present invention is described below. In the following description, description of portions same as those in a method of manufacturing an MRAM of the first embodiment is simplified and different portions are mainly described.

FIGS. 10 to 15 are perspective view showing a method of manufacturing the MRAM of the second embodiment of the present-invention.

Figure 10:
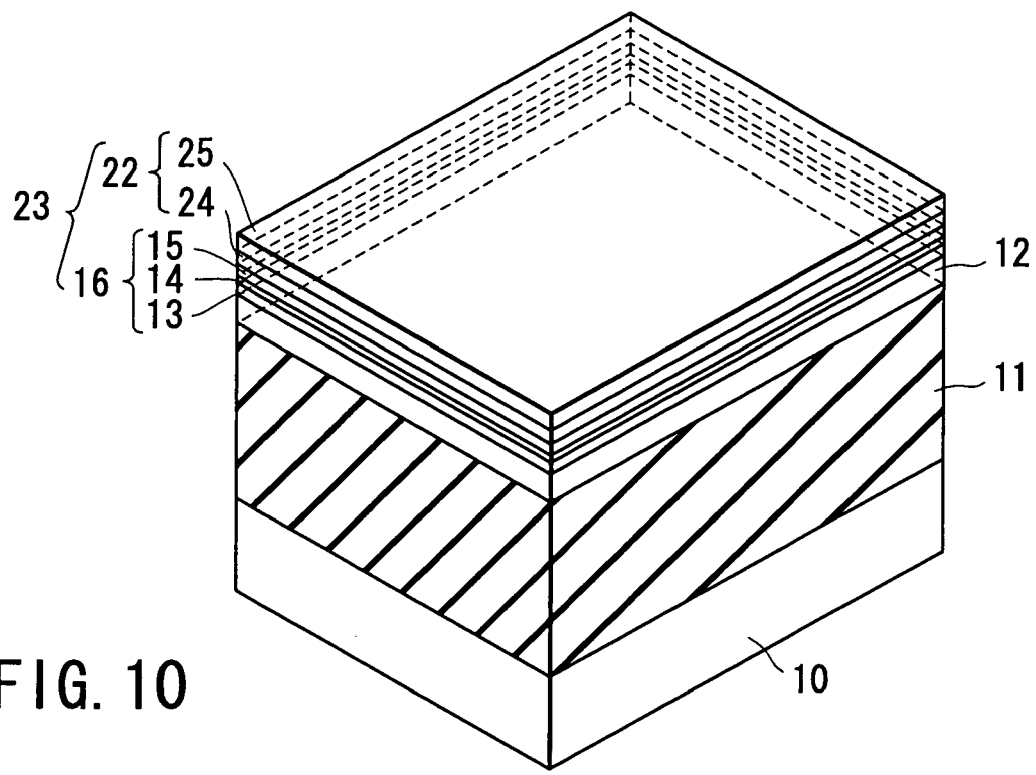
FIG. 10 is a perspective view showing a method of manufacturing the MRAM of the second embodiment of the present invention.

First, as shown in FIG. 10, a first insulating layer 11 is formed on a semiconductor substrate such as a silicon substrate 10. Then, same as the case of first embodiment, the surface of the first insulating layer 11 is flattened so as to absorb steps formed due to a plurality of MOSFETs in accordance with, for example, the CMP method. Then, a first conductive layer 12 is formed on the first insulating layer 11. Then, a TMR-device layer 16 including at least a first conductive layer 13, nonmagnetic layer 14, and second magnetic layer 15 and a composite layer 23 including a rectifying-device layer 22 are formed on the first conductive layer 12. This embodiment shows a case of forming the TMR-device layer 16 on the first conductive layer 12 and the rectifying-device layer 22 on the TMR-device layer 16. However, it is also allowed to form the rectifying-device layer 22 on the first conductive layer 12 and the TMR-device layer 16 on the rectifying-device layer 22 so as to coincide with the modification shown in, for example, FIGS. 9C and 9D. The rectifying-device layer 22 includes a cathode layer 24 and an anode layer 25. This embodiment shows a case of forming the cathode layer 24 on the TMR-device layer 16 and the anode layer 25 on the cathode layer 24. However, it is also allowed to form the anode layer 25 on the TMR-device layer 16 and the cathode layer 24 on the anode layer 25 so as to coincide with the modification shown in FIG. 9B. Moreover, it is allowed to form the cathode layer 24 on the first conductive layer 12, the anode layer 25 on the cathode layer 24, and the TMR-device layer 16 on the anode layer 25 so as to coincide with the modification shown in FIG. 9C. Furthermore, it is allowed to form the anode layer 25 on the first conductive layer 12, the cathode layer 24 on the anode layer 25, and the TMR-device layer 16 on the cathode layer 24 so as to coincide with the modification shown in FIG. 9D. The cathode layer 24 uses a metal or N-type semiconductor as one of materials. The anode layer 25 uses a P-type semiconductor which Schottky-contacts with the above metal or a metal which Schottky-contacts with an N-type semiconductor as one of materials. Thereby, the rectifying-device layer 22 of this embodiment includes a diode or Schottky diode. A semiconductor uses silicon as one of materials. In the case of this embodiment, amorphous silicon is particularly formed. Moreover, one of Ni, Pt, and Mg is used as a metal.

Figure 11:
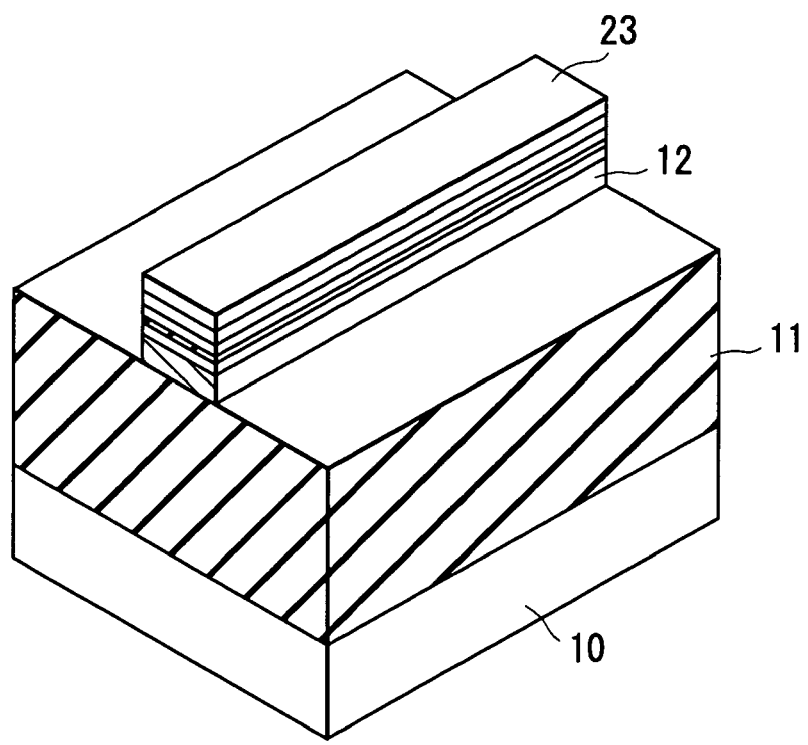
FIG. 11 is a perspective view showing a method of manufacturing the MRAM of the second embodiment of the present invention.

Then, as shown in FIG. 11, the composite layer 23 and first conductive layer 12 are worked by using a mask having a pattern corresponding to a first galvanomagnetic-field wiring pattern. As an example of working, a hard mask layer (not illustrated) is first formed on the composite layer 23. Then, a photoresist layer (not illustrated) is formed on the hard mask layer. Then, the photoresist layer is worked into a pattern corresponding to the first galvanomagnetic-field wiring pattern through normal photolithography. Then, the pattern of the worked the photoresist layer is transferred to the hard mask layer in accordance with the RIE method, that is, the hard mask layer is patterned in accordance with the pattern of the photoresist layer. Then, for the patterned hard mask layer, the composite layer 23 and first conductive layer 12 are etched by using an etching mask through ion milling using Ar gas.

Figure 12:
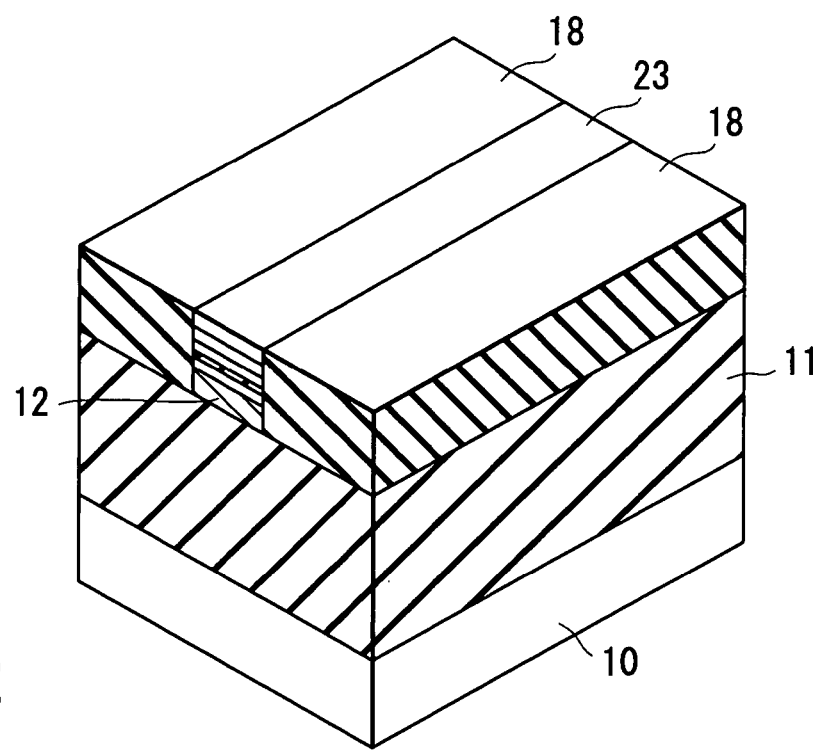
FIG. 12 is a perspective view showing a method of manufacturing the MRAM of the second embodiment of the present invention.

Then, as shown in FIG. 12, a second insulating layer 18 is formed on the first insulating layer 11 and worked composite layer 23. Then, the second insulating layer 18 is flattened so that the upper face of the layer 18 and that of the composite layer 23 are exposed on the same plane through, for example, CMP. By using a hard mask layer as a CMP stopper layer when planarizing the layer 18, it is possible to obtain an advantage that the damage when executing CMP is not directly added to the composite layer 23. When using an insulating material for the hard mask layer, the layer is removed after it is flattened. When using a conductive material for the hard mask layer, it is also possible to leave the layer after it is flattened. It is possible to effectively use the left hard mask layer as a contact material between a second galvanomagnetic-field wiring to be formed later and the composite layer 23.

Figure 13:
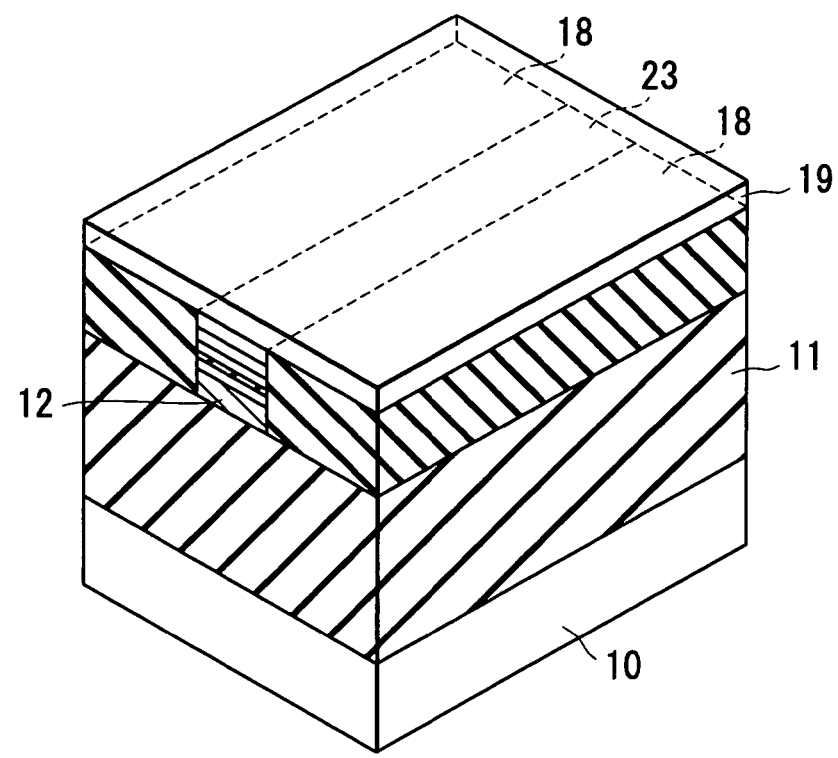
FIG. 13 is a perspective view showing a method of manufacturing the MRAM of the second embodiment of the present invention.

Then, as shown in FIG. 13, a second conductive layer 19 is formed on the second insulating layer 18 and composite layer 23.

Figure 14:
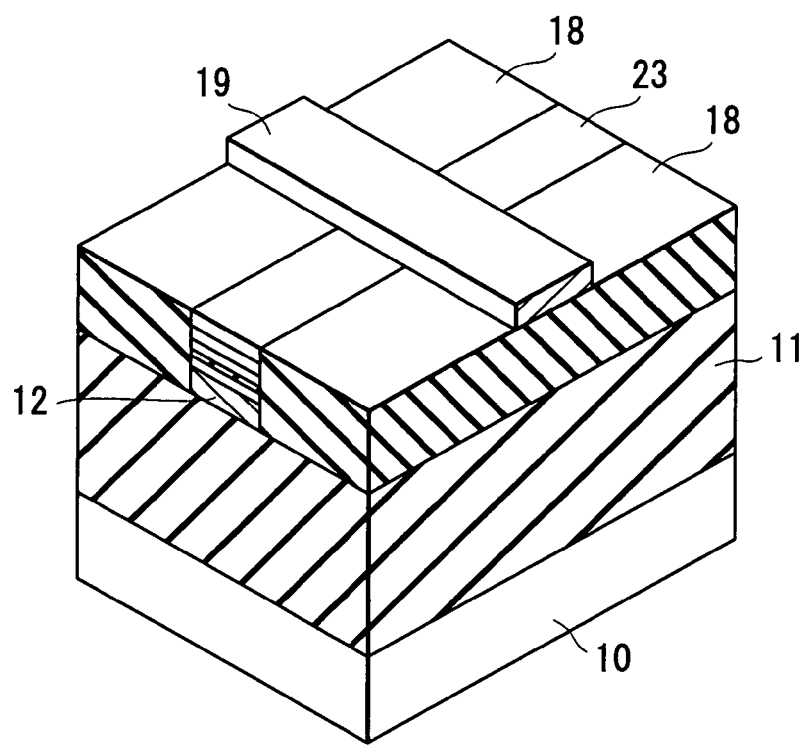
FIG. 14 is a perspective view showing a method of manufacturing the MRAM of the second embodiment of the present invention.
Figure 15:
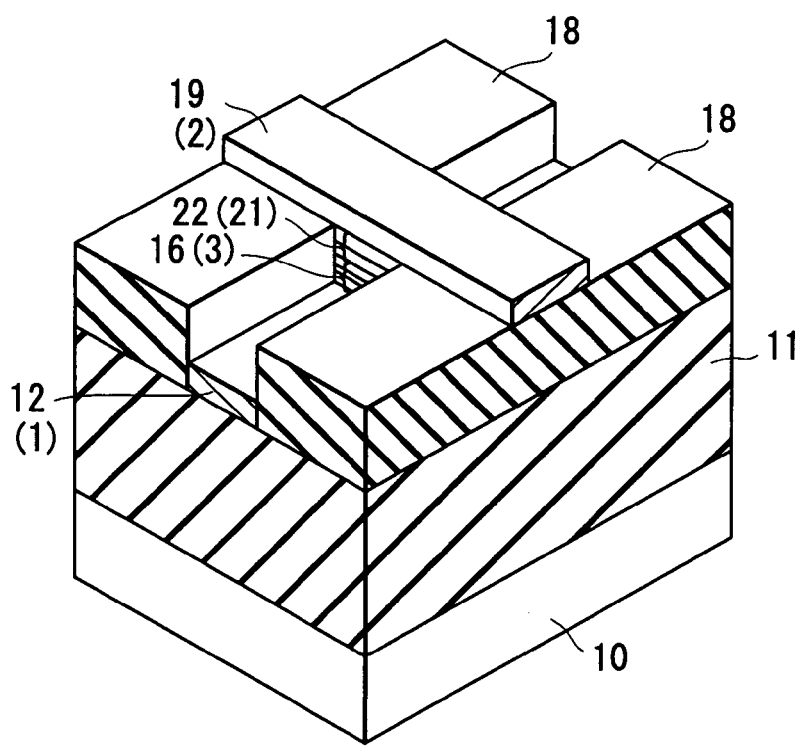
FIG. 15 is a perspective view showing a method of manufacturing the MRAM of the second embodiment of the present invention.

Then, as shown in FIGS. 14 and 15, the second conductive layer 19 and composite layer 23 are worked by using a mask having a pattern corresponding to a second galvanomagnetic-field wiring pattern. As an example of working, a photoresist layer is worked into a pattern corresponding to the second galvanomagnetic-field wiring pattern through normal photolithography. Then, the pattern of the worked photoresist layer is patterned by using an etching mask and thereby adjusting the second conductive layer 19 to the pattern of the photoresist layer. Then, the composite layer 23 is worked by using the photoresist layer and worked second conductive layer 19 as etching masks. Thereby, the second conductive layer 19 serves as the second galvanomagnetic-field wiring 2 and the first conductive layer 12 serves as the first galvanomagnetic-field wiring 1. Moreover, the rectifying-device layer 22 serves as the rectifying device 21 and the TMR-device layer 16 serves as the TMR device 3. Thus, the TMR device 3 having a flat shape coinciding with the planar shape of the crossing portion between the first galvanomagnetic-field wiring 1 and second galvanomagnetic-field wiring 2 and the rectifying device 21 are obtained at the crossing portion.

Finally, a memory cell array portion of the MRAM of the second embodiment is finished by forming a third insulating layer on the structure shown in FIG. 15.

It is also possible to obtain the same advantage as the first embodiment from the above second embodiment.

(Third Embodiment)

Figure 16A:
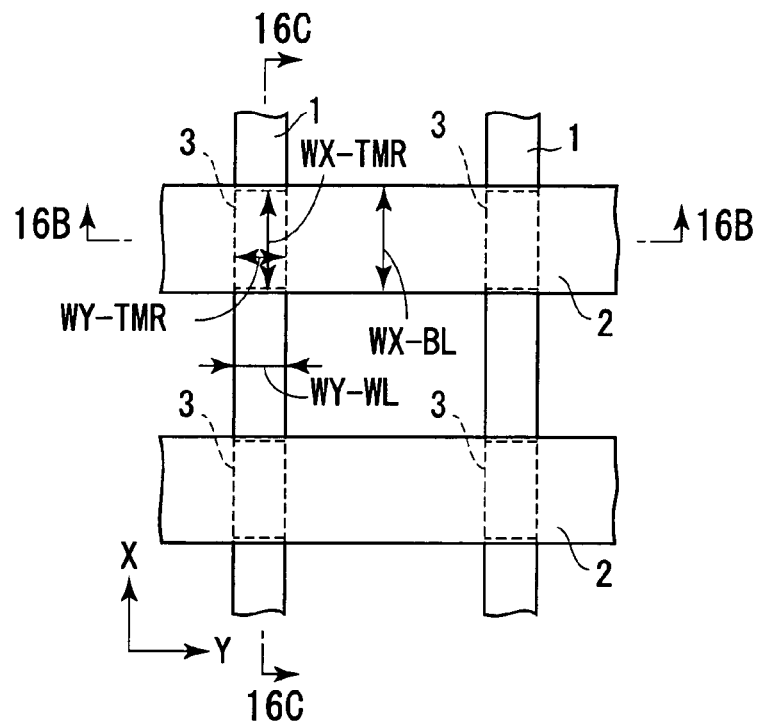
FIG. 16A is a top view showing the MRAM of a third embodiment of the present invention.
Figure 16B:
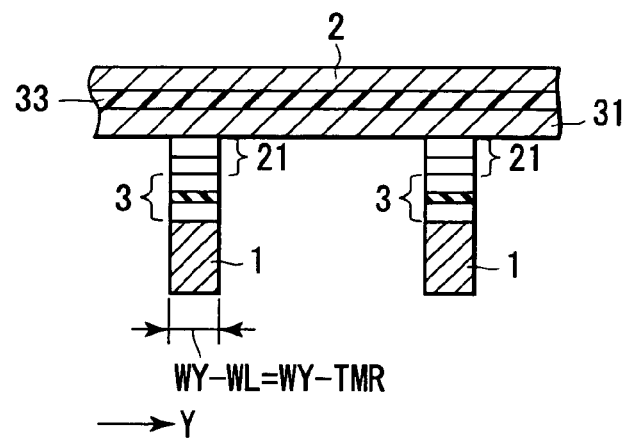
FIG. 16B is a sectional view taken along the line 16B—16B in FIG. 16A.
Figure 16C:
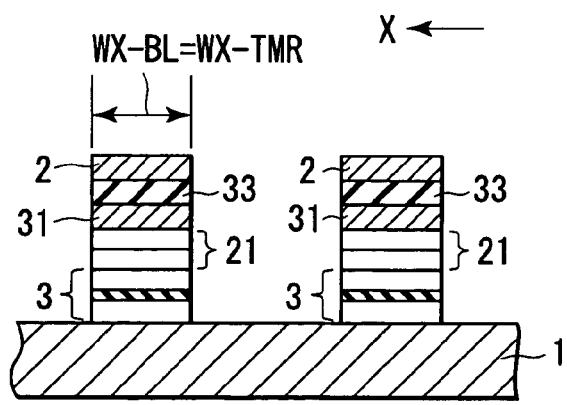
FIG. 16C is a sectional view taken along the line 16C—16C in FIG. 16A.

FIG. 16A is a top view showing an MRAM of a third embodiment of the present invention, FIG. 16B is a sectional view taken along the line 16B—16B in FIG. 16A, and FIG. 16C is a sectional view taken along the line 16C—16C in FIG. 16A.

As shown in FIGS. 16A to 16C, an MRAM of the third embodiment is constituted by using a read wiring 31 used for data read in addition to the second galvanomagnetic-field wiring 2 of the MRAM of the second embodiment. The second galvanomagnetic-field wiring 2 is used as a wiring for generating a write magnetic field for data write. By using the read wiring 31, it is possible to prevent a large current from being directly supplied to a TMR device 3 when data is written. Therefore, it is possible to obtain an advantage that the TMR device 3 can be restrained from being early deteriorated in addition to advantages of the second embodiment.

It is naturally possible to combine the third embodiment with the first embodiment.

Then, a method of manufacturing the MRAM of the third embodiment of the present invention is described below. In the following description, description of portions same as those in a method of manufacturing an MRAM of the second embodiment is simplified and different portions are mainly described.

Figure 17:
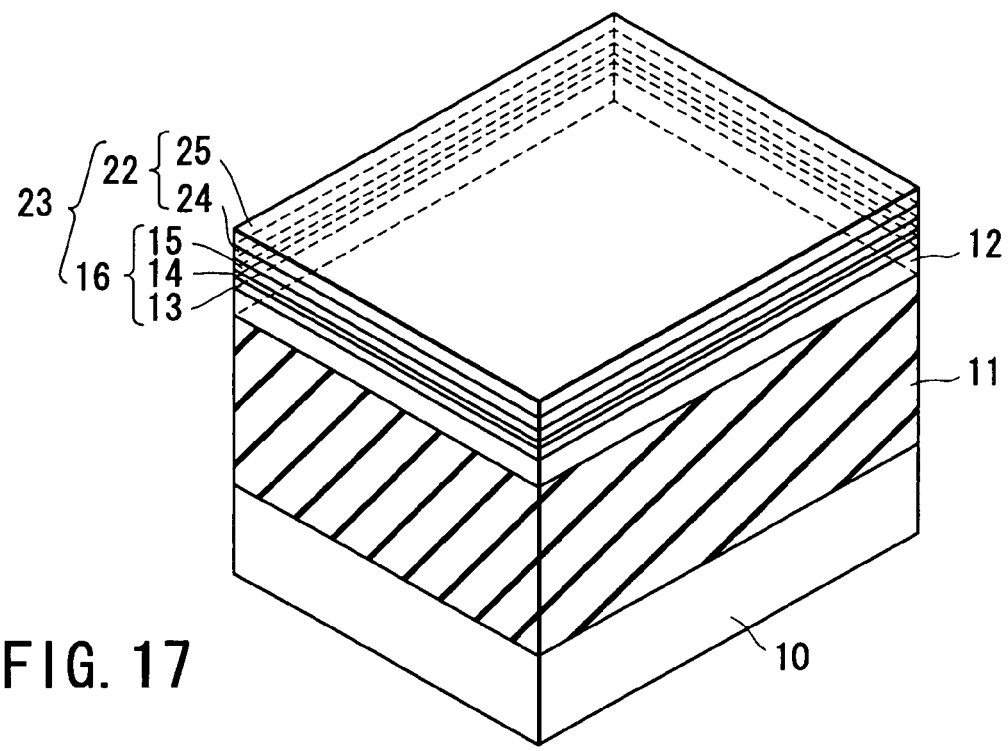
FIG. 17 is a perspective view showing a method of manufacturing the MRAM of the third embodiment.

First, as shown in FIG. 17, a first insulating layer 11 is formed on a semiconductor substrate such as a silicon substrate 10. Then, the surface of the first insulating layer 11 is flattened through, for example, CMP so as to absorb steps formed due to a plurality of MOSFETs the same as the case of the second embodiment. Then, a first conductive layer 12 is formed on the first insulating layer 11. Then, a TMR-device layer 16 including at least a first magnetic layer 13, nonmagnetic layer 14, and second magnetic layer 15 and a composite layer 23 including a rectifying-device layer 22 are formed on the first conductive layer 12. However, it is not necessary to form a rectifying-device layer 22. In this case, it is possible to obtain the MRAM constituted by combining the third embodiment with the first embodiment.

Figure 18:
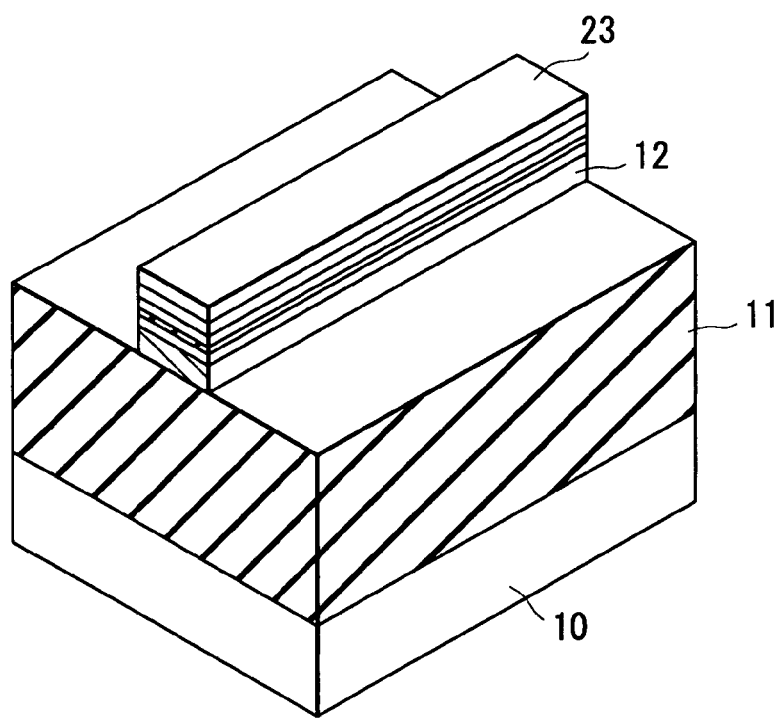
FIG. 18 is a perspective view showing a method of manufacturing the MRAM of the third embodiment.

Then, as shown in FIG. 18, the composite layer 23 and first conductive layer 12 are worked by using a mask having a pattern corresponding to a first wiring pattern.

Figure 19:
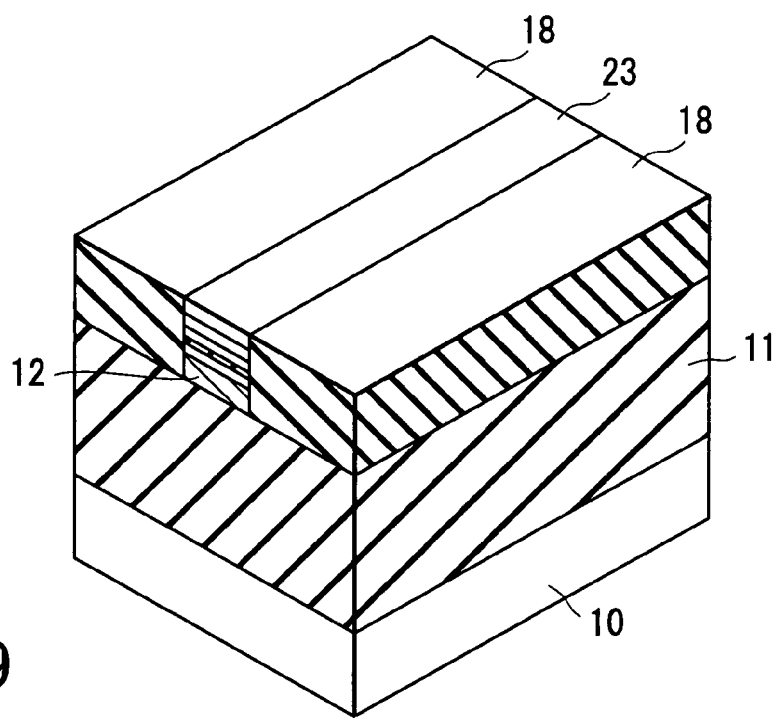
FIG. 19 is a perspective view showing a method of manufacturing the MRAM of the third embodiment.

Then, as shown in FIG. 19, a second insulating layer 18 is formed on the worked composite layer 23 and first insulating layer 11. Then, the second insulating layer 18 is flattened through, for example, CMP so that the upper face of the layer 18 and that of the composite layer 23 are exposed on the same plane.

Figure 20:
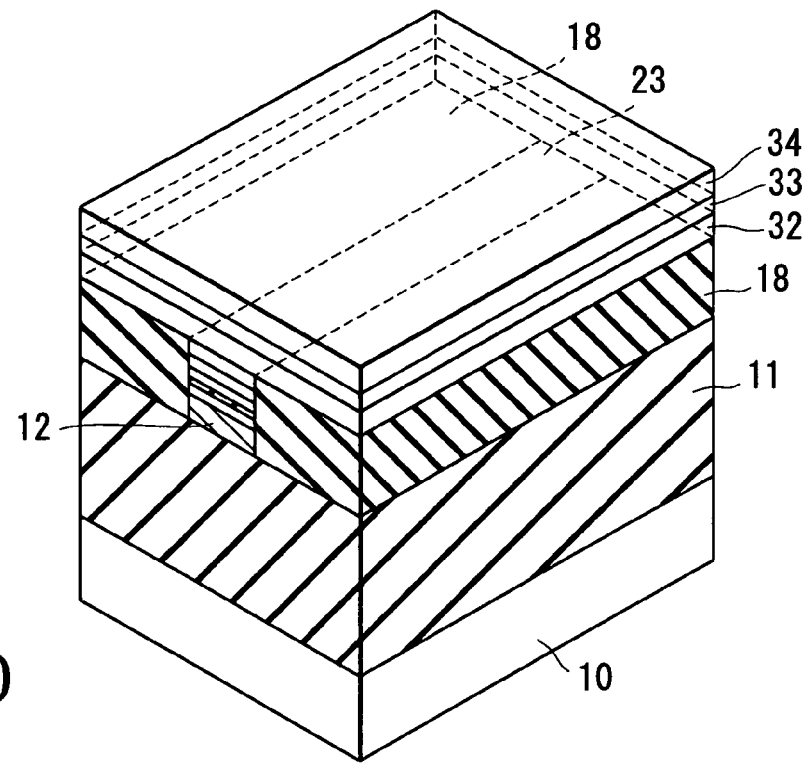
FIG. 20 is a perspective view showing a method of manufacturing the MRAM of the third embodiment.

Then, as shown in FIG. 20, a second conductive layer 32 is formed on the second insulating layer 18 and composite layer 23. The second conductive layer 32 is a layer serving as the read wiring 31 and uses Ta as one of materials. The thickness of the layer 32 is, for example, 50 nm. Then, a third insulating layer 33 is formed on the second conductive layer 32. The third insulating layer 33 is a layer for insulating the read wiring 31 from the second galvanomagnetic-field wiring 2 and uses $SiO_2$ as one of materials. Moreover, the thickness of the layer 33 is, for example, 50 nm. Then, a third conductive layer 34 is formed on the third insulating layer 33. The third conductive layer 34 is a layer serving as a second galvanomagnetic-field wiring and uses Al as one of materials.

Figure 21:
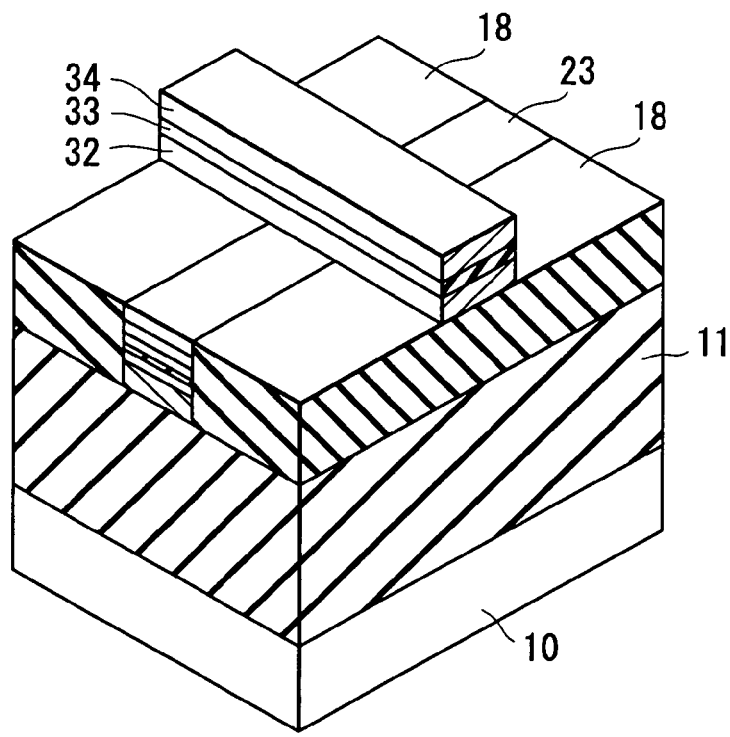
FIG. 21 is a perspective view showing a method of manufacturing the MRAM of the third embodiment.
Figure 22:
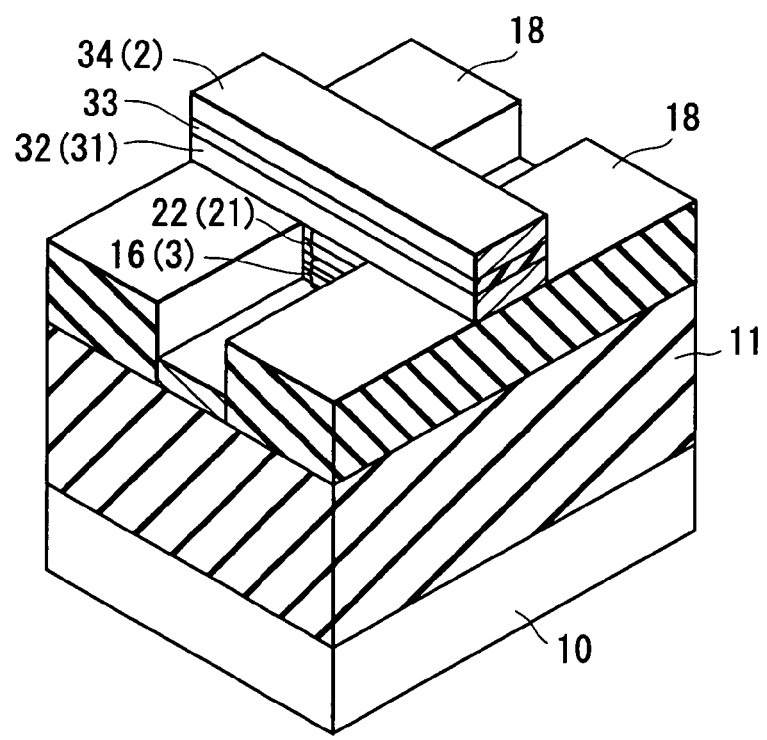
FIG. 22 is a perspective view showing a method of manufacturing the MRAM of the third embodiment.

Then, as shown in FIGS. 21 and 22, the third conductive layer 34, third insulating layer 33, second conductive layer 32, and composite layer 23 are worked by using a mask corresponding to a second galvanomagnetic-field wiring pattern. As an example of working, a photoresist layer is worked into a pattern corresponding to the second galvanomagnetic-field wiring pattern through normal photolithography. Then, the pattern of the worked photoresist layer is patterned by using an etching pattern and adjusting the third conductive layer 34 to the pattern of the photoresist layer. Then, the third insulating layer 33, second conductive layer 32, and composite layer 23 are worked by using the photoresist layer and worked third conductive layer 34 as etching masks. Thereby, the third conductive layer 34 serves as the second galvanomagnetic-field wiring 2, the second conductive layer 32 serves as the read wiring 31, and the first conductive layer 12 serves as the first galvanomagnetic-field wiring 1. Then, the TMR device 3 and the rectifying-device layer 21 having a flat shape coinciding with the planar shape of the crossing portion between the first galvanomagnetic-field wiring 1 and the second galvanomagnetic-field wiring 2 are obtained at the crossing portion.

Finally, a memory array portion of the MRAM of the third embodiment is finished by forming a fourth insulating layer on the structure shown in FIG. 22.

It is also possible to obtain the same advantages as the first and second embodiments from the third embodiment.

(Fourth Embodiment)

Figure 23A:
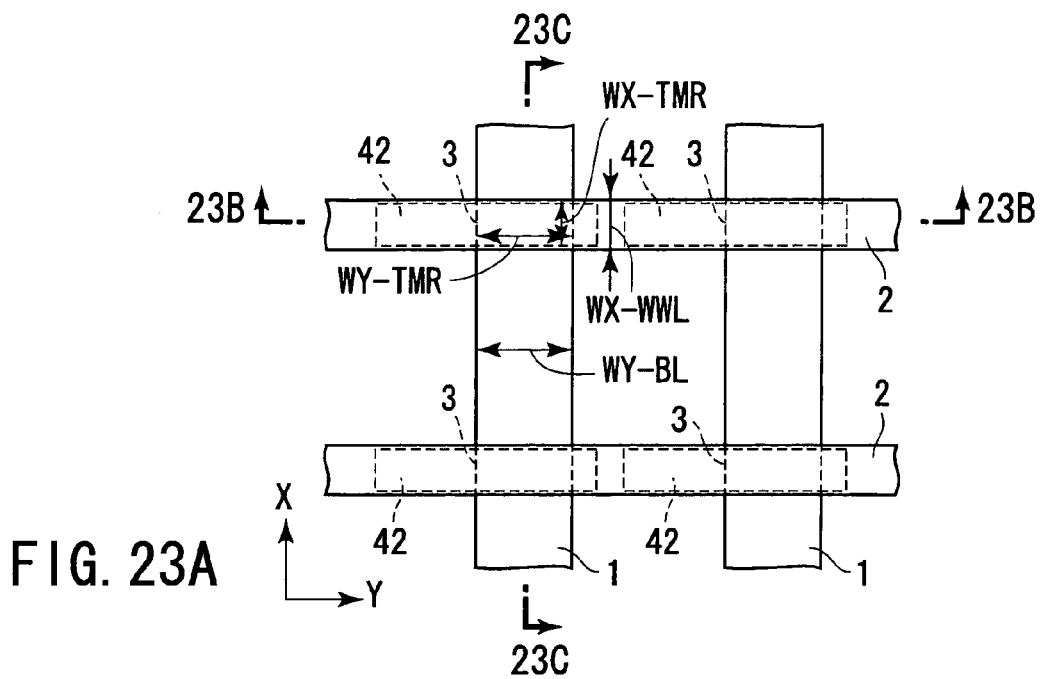
FIG. 23A is a top view showing an MRAM of a fourth embodiment of the present invention.
Figure 23B:
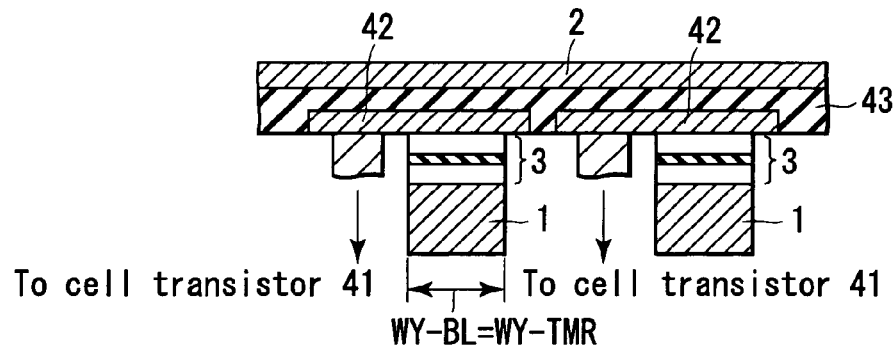
FIG. 23B is a sectional view taken along the line 23B—23B in FIG. 23A.
Figure 23C:
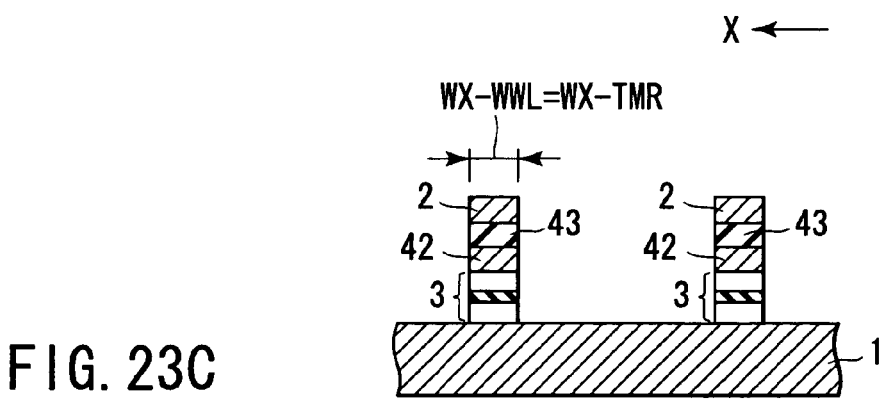
FIG. 23C is a sectional view taken along the line 23C—23C in FIG. 23A.

FIG. 23A is a top view showing an MRAM of a fourth embodiment of the present invention, FIG. 23B is a sectional view taken along the line 23B—23B in FIG. 23A, and FIG. 23C is a sectional view taken along the line 23C—23C in FIG. 23A.

Moreover, FIG. 24 is an equivalent circuit diagram of the MRAM of the fourth embodiment of the present invention.

As shown in FIGS. 23A, 23B, and 23C and FIG. 24, the MRAM of the fourth embodiment has a one-TMR device one-transistor-type memory cell including one TMR device 3 and one cell transistor 41. The gate G of the cell transistor 41 is connected to a read word line RWL. The read word line RWL of this embodiment is formed along the second direction Y. The source S of the cell transistor 41 is connected to a source line SL and, for example, grounded. The drain D of the cell transistor is connected to one end of a lead electrode 42. The other end of the lead electrode 42 is connected to one end of the TMR device 3. One end of the TMR device 3 is, for example, a magnetized fixed layer. The other end of the TMR device 3 is connected to the first galvanomagnetic-field wiring 1. The first galvanomagnetic-field wiring 1 of this embodiment functions as a bit line and is formed in the first direction X. The other end of the TMR device 3 is, for example, a magnetic recording layer. The TMR device 3 of this embodiment is formed on the first galvanomagnetic-field wiring 1 below the lead electrode 42. An insulating layer 43 is formed on the lead electrode 42 and the second galvanomagnetic-field wiring 2 is formed on the insulating layer 43. The second galvanomagnetic-field wiring 2 of this embodiment functions as a write word line and is formed along the second direction Y.

When data is written, a write current is simultaneously supplied to the first galvanomagnetic-field wiring 1 and the second galvanomagnetic-field wiring 2 as shown by the arrow in FIG. 24. Then, data is written in the TMR device 3 present at a cross.

When data is read, a selected cell transistor is turned on. Thereby, as shown by the dotted line in FIG. 24, a read current flows from the first galvanomagnetic-field wiring 1 toward the source line SL. The value of the read current is determined by, for example, a sense amplifier (not illustrated) connected to the first galvanomagnetic-field wiring 1.

In the case of the fourth embodiment, the TMR device 3 is formed on the bit line (first galvanomagnetic-field wiring 1) below the lead electrode 42. Thereby, an advantage is obtained that the TMR device 3 can be formed on the lead electrode 42 and a write word line is made to further approach to the TMR device 3 compared to the case of the MRAM formed below a bit line. Because the write word line is made to further approach to the TMR device 3, a write magnetic field can be easily supplied to the TMR device 3 and data can be easily written.

Moreover, because the TMR device 3 is formed below the lead electrode 42, working of the lead electrode 42 is not influenced by working of the TMR device 3. Therefore, it is possible to decrease the lead electrode 42 in thickness. Furthermore, the fluctuation of the thickness of the lead electrode 42 is restrained. Thereby, it is possible to restrain the fluctuation of a resistance value between a bit line and a cell transistor. Thus, the reliability for data read is also improved.

Furthermore, a cell transistor is provided for each memory cell. Therefore, it is possible to separate the current supplied from an optionally selected memory cell from the current supplied from other memory cell when reading data. Therefore, it is possible to improve a read signal margin such as an S/N ratio for read. Thereby, the reliability of the read operation is improved and it is possible to accelerate the read operation.

Then, a method of manufacturing the MRAM of the fourth embodiment of the present invention is described below. In the following description, description of portions same as those in a method of manufacturing the MRAM of the first embodiment is simplified and different portions are mainly described.

FIGS. 25 to 38 are perspective views showing a method of manufacturing the MRAM of the fourth embodiment of the present invention.

First, as shown in FIG. 25, a shallow trench corresponding to a device isolation region is formed on a semiconductor substrate such as a P-type silicon substrate 10. Then, the shallow trench is filled with an insulating material such as $SiO_2$ to form a device isolation region (shallow-trench isolation:STI) 44. Thereby, a device region 45 is partitioned on the substrate 10. Then, the surface of the silicon substrate 10, particularly, the surface of the device region 45 is thermally oxidized to form a gate insulating film ($SiO_2$) 46. Then, conductive polysilicon is deposited on the substrate 10 and device isolation region 44 to form a conductive polysilicon film. Then, the conductive polysilicon film is patterned to form a gate electrode 47. Then, an N-type impurity such as arsenic or phosphor is ion-implanted into the substrate 10 by using the gate electrode 47 and device isolation region 44 as masks and moreover diffused to form an N-type source/drain region 48.

Then, as shown in FIG. 26, an insulating material such as $SiO_2$ is deposited on the structure shown in FIG. 25 to form a first layer-insulating film 11-1. Then, an opening reaching the N-type source/drain region 48 is formed on the first layer-insulating film 11-1. Then, the opening is filled with a conductive material, that is, a metal such as tungsten to form a first-layer metal-substrate via 49.

Figure 27:
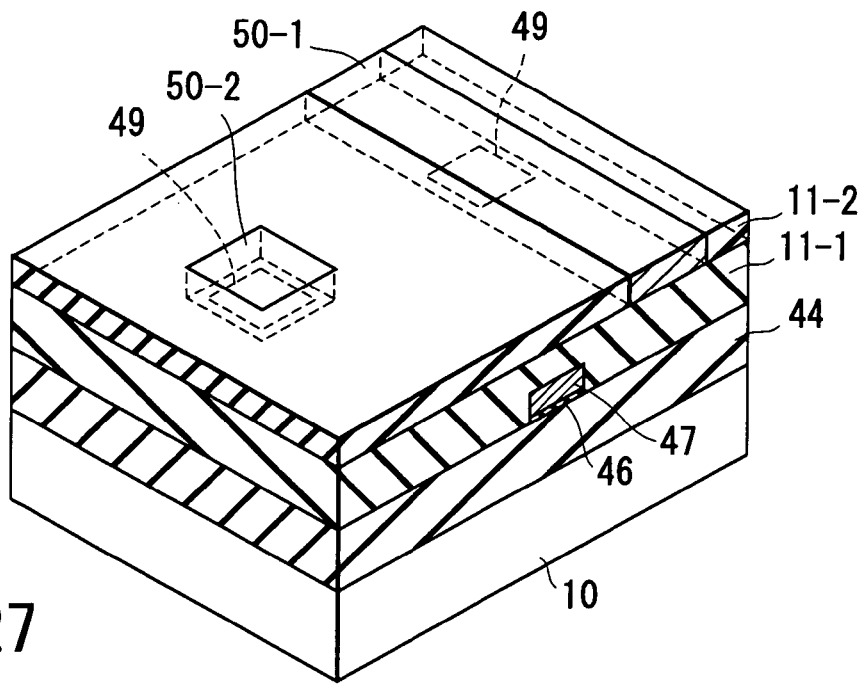
FIG. 27 is a perspective view showing a method of manufacturing the MRAM of the fourth embodiment of the present invention.

Then, as shown in FIG. 27, an insulating material such as $SiO_2$ is deposited on the structure shown in FIG. 26 to form a second layer-insulating film 11-2. Then, a first-layer metal-wiring trench reaching a contact 49 is formed on a second layer-insulating film 8. Then, the wiring trench is filled with a conductive material, that is, a metal such as tungsten to form a wiring formed by a first-layer metal layer 50. Thereby, in the case of this embodiment, a wiring 50-1 serving as a source line and a wiring 50-2 to be connected to a via among wirings are formed.

Figure 28:
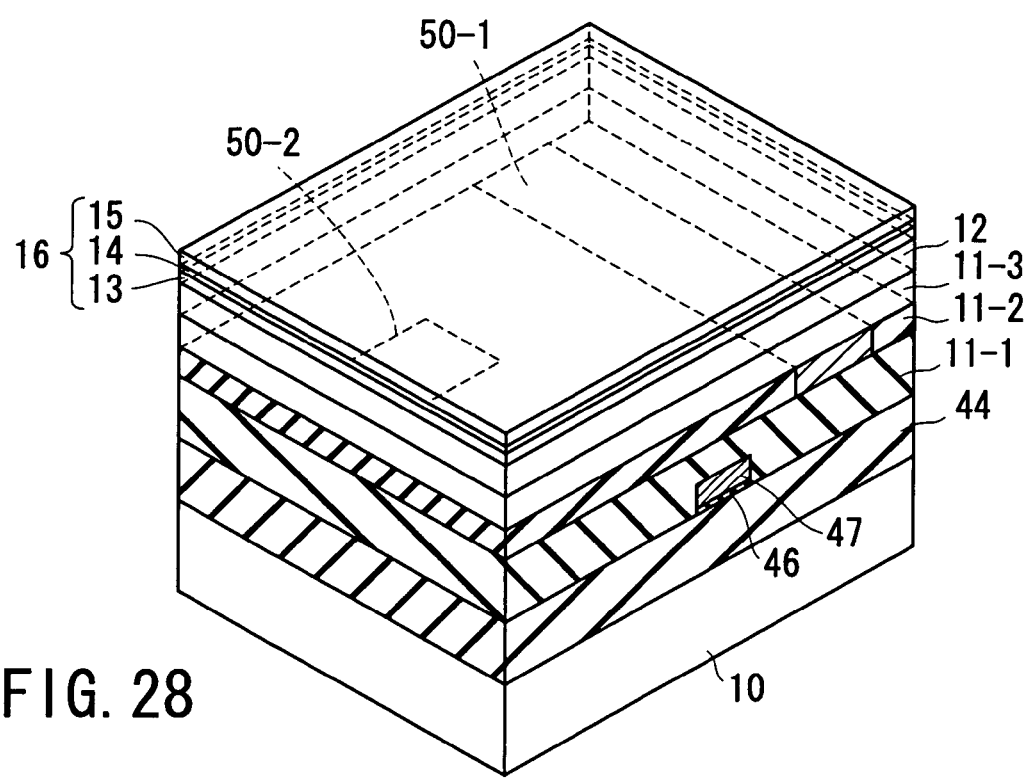
FIG. 28 is a perspective view showing a method of manufacturing the MRAM of the fourth embodiment of the present invention.

Then, as shown in FIG. 28, an insulating material such as $SiO_2$ is deposited on the structure shown in FIG. 27 to form a third layer-insulating film 11-3. then, a second layer metal 12 is formed on the third layer-insulating film 11-3. Then, a TMR-device layer 16 including at least a first magnetic layer 13, nonmagnetic layer 14, and second magnetic layer 15 is formed on the second layer metal 12.

Figure 29:
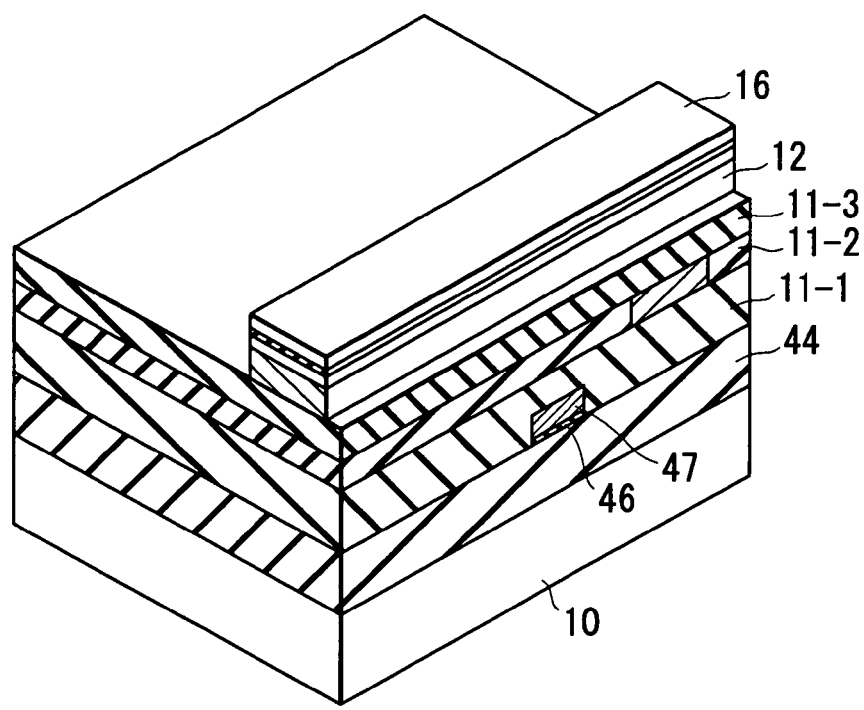
FIG. 29 is a perspective view showing a method of manufacturing the MRAM of the fourth embodiment of the present invention.

Then, as shown in FIG. 29, the TMR-device layer 16 and second-layer metal 12 are worked by using a mask having a pattern corresponding to a first galvanomagnetic-field wiring pattern.

Figure 30:
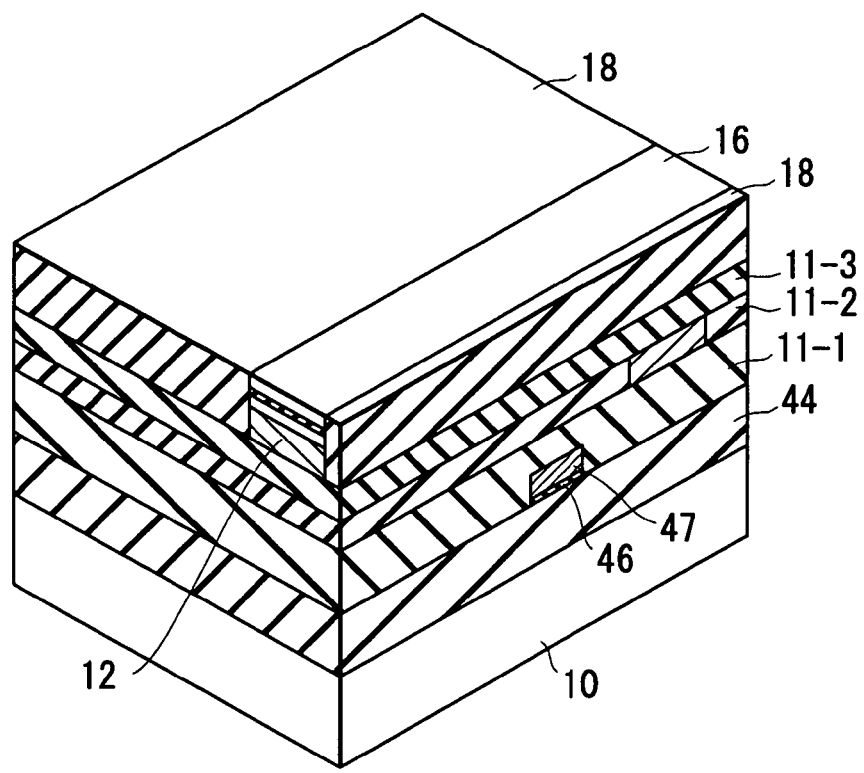
FIG. 30 is a perspective view showing a method of manufacturing the MRAM of the fourth embodiment of the present invention.

Then, as shown in FIG. 30, a fourth layer-insulting film 18 is formed on the third layer-insulating film 11-3 and worked TMR-device layer 16. Then, the fourth layer-insulating film 18 is flattened through, for example, CMP so that the upper face of the film 18 and that of the composite layer 23 are exposed on the same plane.

Figure 31:
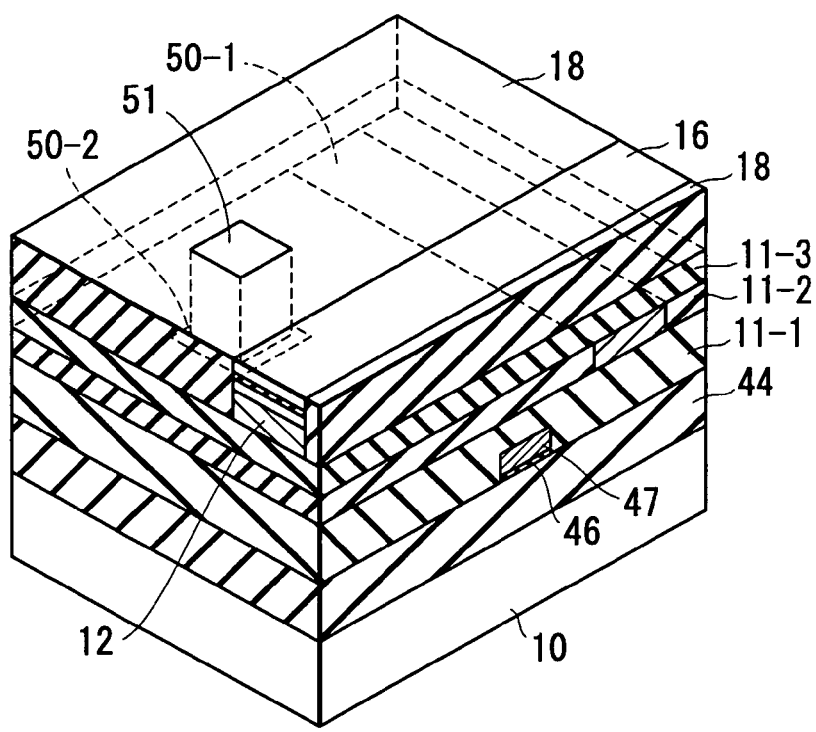
FIG. 31 is a perspective view showing a method of manufacturing the MRAM of the fourth embodiment of the present invention.

Then, as shown in FIG. 31, an opening reaching the wiring 50-2 is formed on the fourth layer-insulating film 12 and third layer-insulating film 11-3. Then, the opening is filled with a conductive material, that is, a metal such as tungsten to form a first-layer metal-extra-metal via 51.

Figure 32:
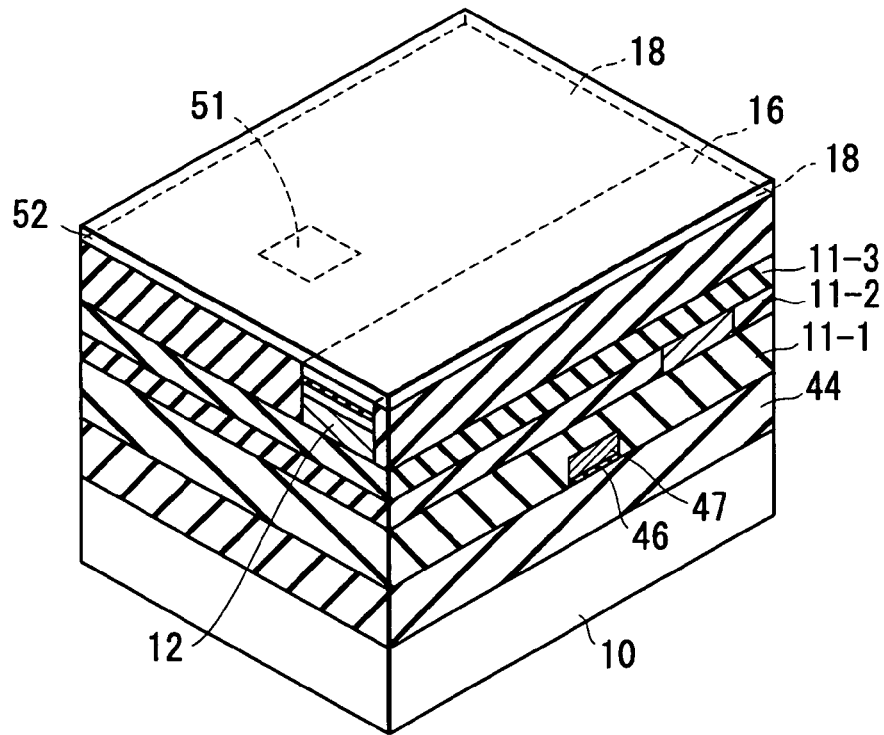
FIG. 32 is a perspective view showing a method of manufacturing the MRAM of the fourth embodiment of the present invention.

Then, as shown in FIG. 32, a conductive material such as tungsten is deposited on the structure shown in FIG. 31 to form an extra-metal layer 52.

Figure 33:
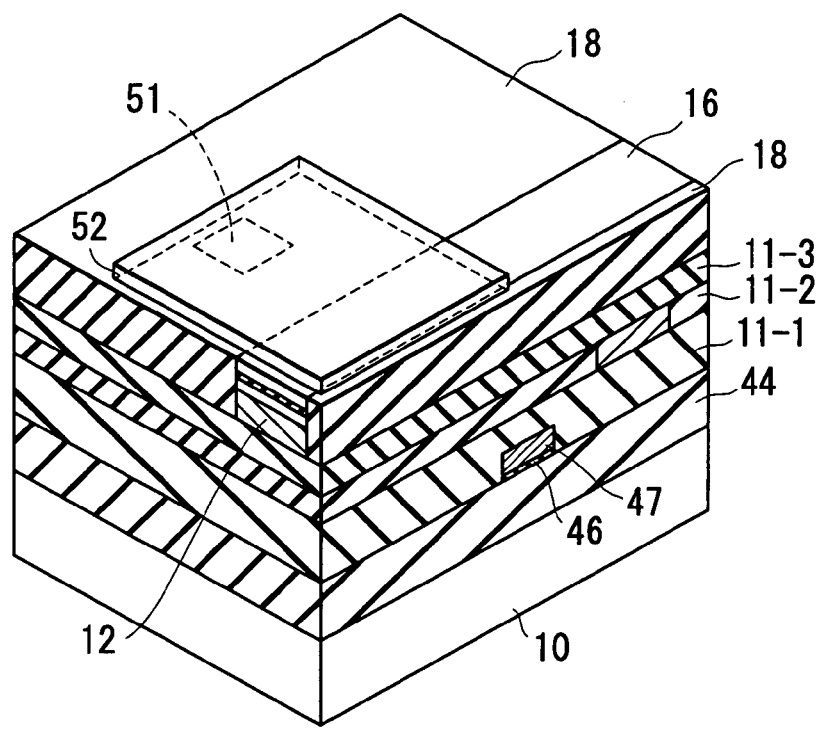
FIG. 33 is a perspective view showing a method of manufacturing the MRAM of the fourth embodiment of the present invention.

Then, as shown in FIG. 33, the extra-metal layer 52 is worked into a pattern which contacts with the TMR-device layer 16 and via 51.

Figure 34:
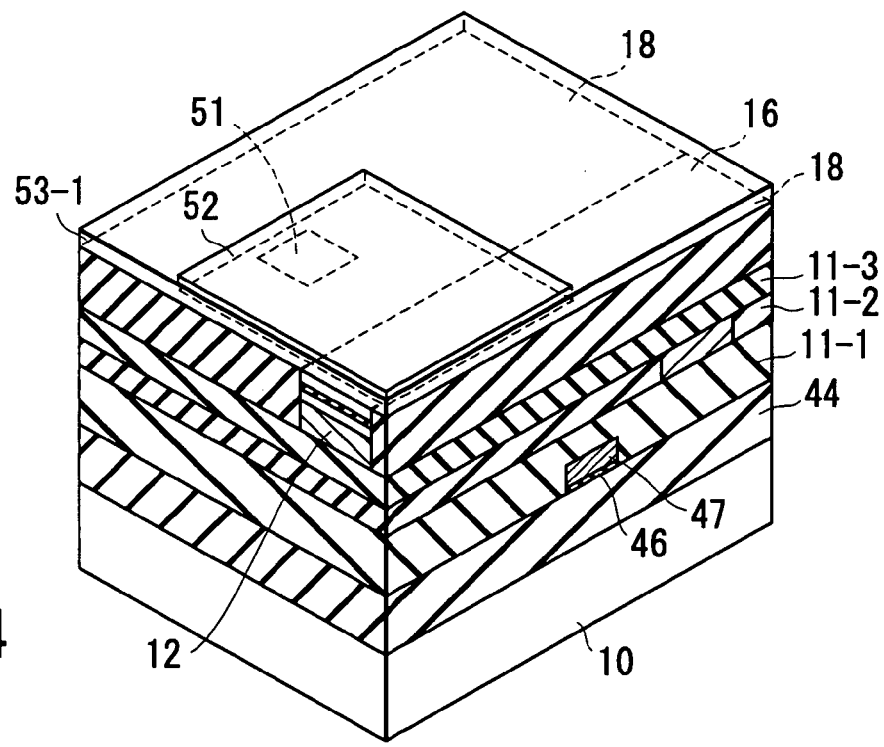
FIG. 34 is a perspective view showing a method of manufacturing the MRAM of the fourth embodiment of the present invention.

Then, as shown in FIG. 34, a fifth layer-insulating film 53-1 is formed on the fourth layer-insulating film 18, TMR-device layer 16, and worked extra metal layer 52. Then, the fifth layer-insulating film 53-1 is flattened through, for example, CMP so that the upper face of the film 53-1 and that of the extra metal layer are exposed on the same plane.

Figure 35:
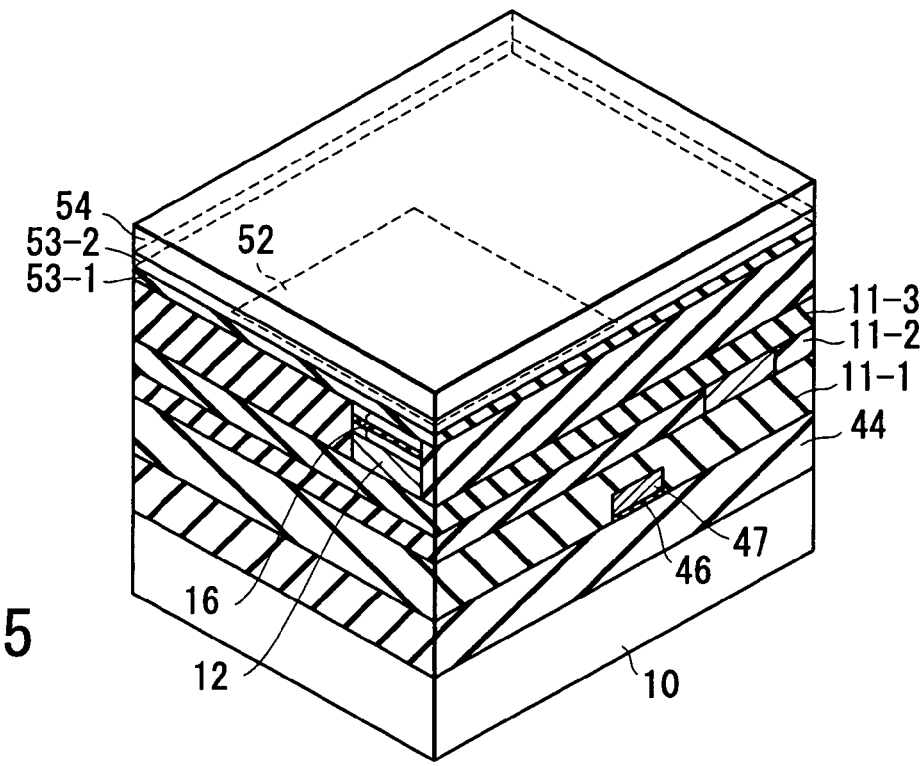
FIG. 35 is a perspective view showing a method of manufacturing the MRAM of the fourth embodiment of the present invention.

Then, as shown in FIG. 35, a sixth layer-insulating film 53-2 is formed on the structure shown in FIG. 34. Then, a third-layer meal 54 is formed on the sixth layer-insulating film 53-2.

Figure 36:
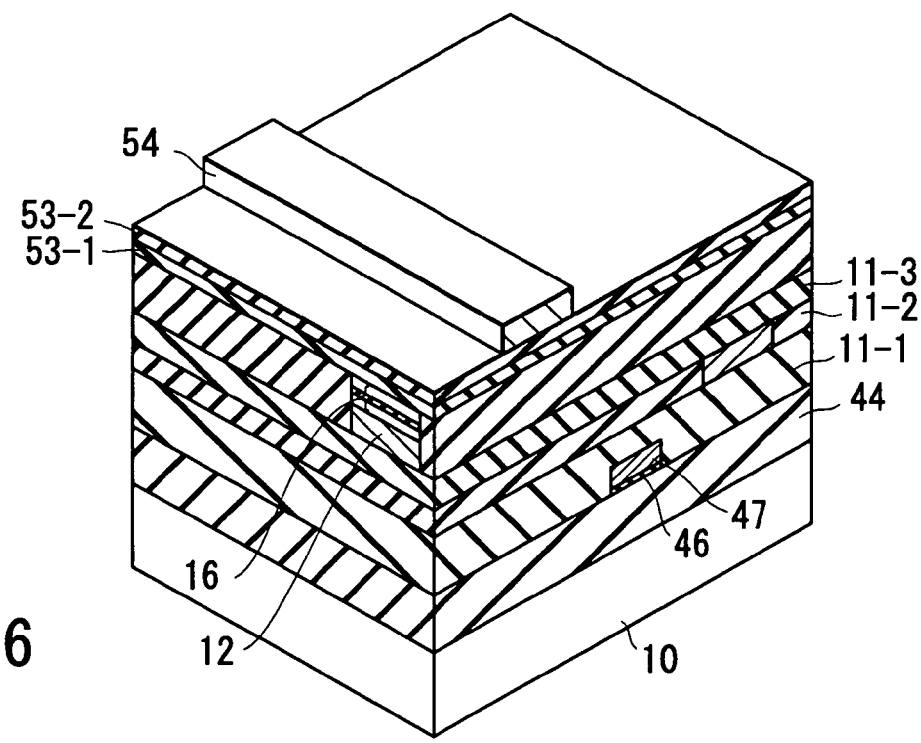
FIG. 36 is a perspective view showing a method of manufacturing the MRAM of the fourth embodiment of the present invention.
Figure 37:
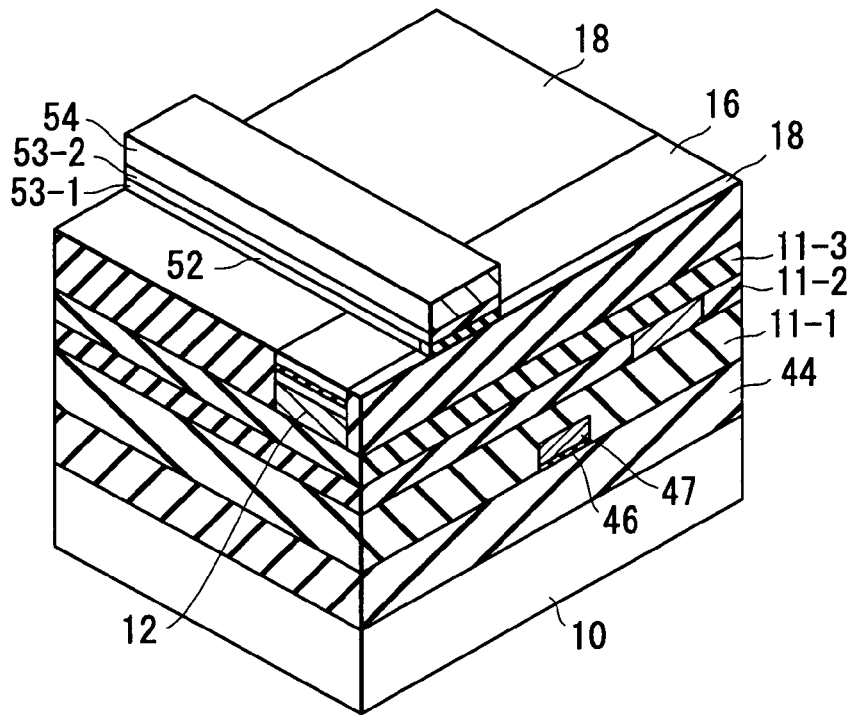
FIG. 37 is a perspective view showing a method of manufacturing the MRAM of the fourth embodiment of the present invention.
Figure 38:
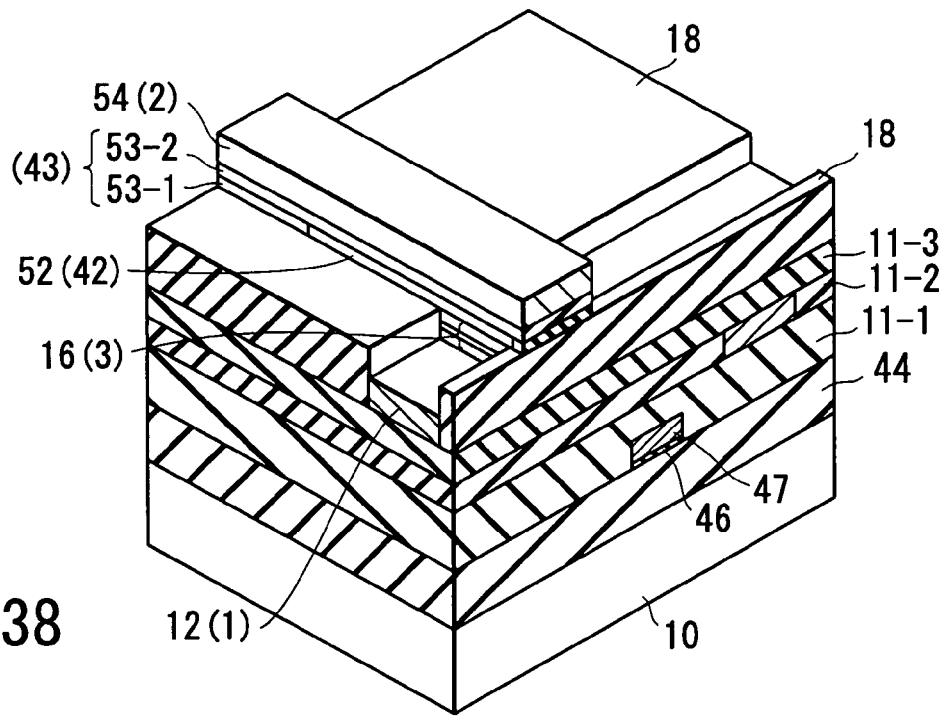
FIG. 38 is a perspective view showing a method of manufacturing the MRAM of the fourth embodiment of the present invention.

Then, as shown in FIGS. 36 to 38, the third-layer metal 54 is worked by using a mask having a pattern corresponding to a second galvanomagnetic-field wiring pattern. As an example of working, a photoresist layer is worked into a pattern corresponding to the second galvanomagnetic-field wiring pattern through normal photolithography. Then, the pattern of the worked photoresist layer is patterned by using an etching mask and thereby adjusting the third-layer metal 54 to the pattern of the photoresist layer. Then, the sixth layer-insulating film 53-2 and fifth layer-insulating film 53-1 are etched by using the photoresist layer and worked third-layer metal 54 as etching masks. Then, etching is executed to work the TMR-device layer 16. Thereby, the third-layer metal 54 serves as the second galvanomagnetic-field wiring 2 and the extra metal layer 52 serves as the lead electrode 42. Moreover, the TMR-device layer 16 serves as the TMR device 3 and the second-layer metal 12 serves as the first galvanomagnetic-field wiring 1. Thus, the TMR device 3 having a flat shape coinciding with the planar shape of the crossing portion between the first galvanomagnetic-field wiring 1 and the second galvanomagnetic-field wiring 2 at the crossing portion.

Finally, a memory array portion of the MRAM of the fourth embodiment is finished by forming a seventh layer-insulating film on the structure shown in FIG. 38.

It is also possible to obtain advantages same as those of the first, second, and third embodiments from the fourth embodiments.

(Fifth Embodiment)

Figure 39A:
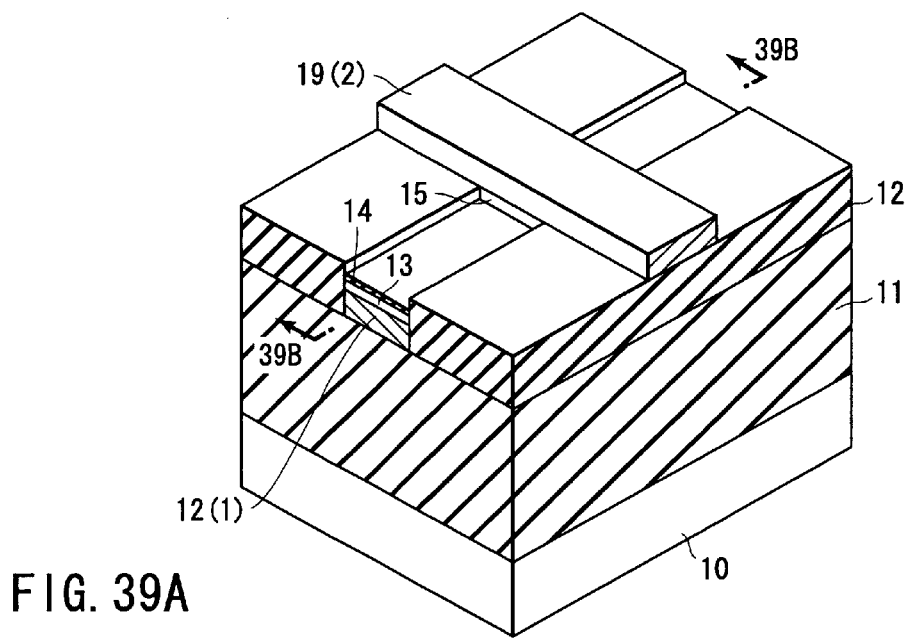
FIG. 39A is a perspective view showing a method of manufacturing an MRAM of a fifth embodiment of the present invention.
Figure 39B:
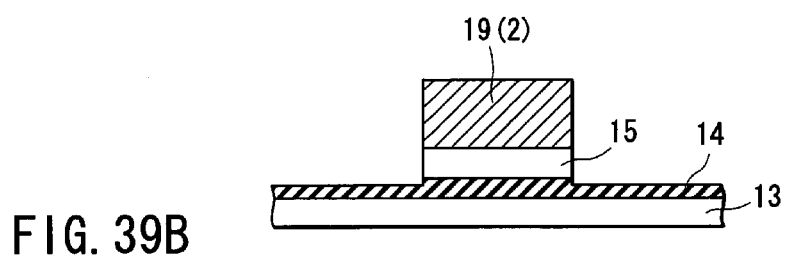
FIG. 39B is a sectional view taken along the line 39B—39B in FIG. 39A.

FIG. 39A is a perspective view showing a method of manufacturing an MRAM of a fifth embodiment of the present invention and FIG. 39B is a sectional view taken along the line 39B—39B in FIG. 39A.

As shown in FIGS. 39A and 39B, to work a TMR-device layer 16, it is also possible to work only either of a first magnetic layer 13 and second magnetic layer 15 and stop working at a nonmagnetic layer 14. For example, when a TMR-device layer 16 is a TMR layer including a magnetic recording layer, tunnel blocking layer, and magnetized fixed layer, the magnetic recording layer is worked to stop working at the tunnel blocking layer. Thereby, in the case of the MRAM of the fifth embodiment, at least the planar shape of the magnetic recording layer coincides with that of the crossing portion between first galvanomagnetic-field wiring 1 and second galvanomagnetic-field wiring 2 and at least the planar shape of the magnetized fixed layer coincides with that of the first galvanomagnetic-field wiring.

In the case of the fifth embodiment, to work the TMR-device layer 16, only either of the first magnetic layer 13 and second magnetic layer 15 is worked to stop working at the nonmagnetic layer 14. Therefore, when working the TMR-device layer 16, an advantage can be obtained that it is possible to prevent up to the first galvanomagnetic-field wiring 1 from being worked, for example, being etched.

(Types of TMR Device)

(First Type)

It is possible to use a TMR device for the TMR devices 3 described for the first to fifth embodiments. Several types of TMR devices are described below.

FIG. 40A is a sectional view showing a first-type TMR device.

As shown in FIG. 40A, an antiferrormagnetic layer 151, ferromagnetic layer 152, tunnel blocking layer 153, ferromagnetic layer 154, and protective layer 155 are formed in order on a ground layer 150.

In the case of this embodiment, the ferromagnetic layer 152 functions as a magnetized fixed layer whose spin direction is fixed and the ferromagnetic layer 154 functions as a magnetic recording layer whose spin directions are changed. The antiferromagnetic layer 151 is a layer for fixing the spin direction of the ferromagnetic layer 152. It is allowed to fix the spin direction of the ferromagnetic layer 152 functioning as a magnetized fixed layer by using the antiferromagnetic layer 151.

The ground layer 150 is a layer for allowing a ferromagnetic layer or antiferromagnetic layer to be easily formed or protecting the ferromagnetic layer, which is formed according to necessity. The protective layer 155 is a layer for protecting, for example, a ferromagnetic layer or antiferromagnetic layer, which is formed according to necessity the same as the case of the ground layer 150. It is allowed that the protective layer 155 is formed by using the hard mask layer described for, for example, the first embodiment.

Matters about these ground layer 150 and protective layer 155 can be also applied to second to fourth examples described below.

The ferromagnetic layers 152 and 154 use one of the following materials.

Fe, Co, and Ni or alloy of them

Magnetite having a large spin polarizability

Oxides such as $CrO_2$ and $RXMnO_3$-y (R:Rare earth, X:Ca, Ba, or Sr)

Heuslser alloys such as NiMnSb and PtMnSb

It is allowed that a nonmagnetic element is contained the ferromagnetic layers 152 and 154 as long as the layers do not lose ferromagnetism.

The following elements are included in nonmagnetic elements.

Ag, Cu, Au, Al, Mg, Si, Bi, Ta, B, C, O, N, Pd, Pt, Zr, Ir, W, Mo, and Nb

It is necessary to set the thickness of each of the ferromagnetic layers 152 and 154 to a value at which the layers do not become super-paramagnetic or more. For example, the thickness of each of the ferromagnetic layer 152 and 154 is set to 0.4 nm or more. Moreover, though the upper limit of the thickness of each of the ferromagnetic layers 152 and 154 is not restricted, it is preferable to set the thickness to 100 nm or less from the viewpoint of manufacturing a TMR device.

The antiferromagnetic layer 151 can use one of the following materials.

Fe—Mn, Pt—Mn, Pt—Cr—Mn, Ni—Mn, Ir—Mn, NiO, and $Fe_2O_3$

The tunnel blocking layer 153 can use one of the following materials.

$Al_2O_3$, $SiO_2$, MgO, AlN, $Bi_2O_3$, $MgF_2$, $CaF_2$, $SrTiO_2$, and $AlLaO_3$ It is allowed that a material of the tunnel blocking layer 153 further contains at least any one of oxygen, nitrogen, and fluorine as long as the material does not lose its insulating property and lacks in any one of oxygen, nitrogen, and fluorine as long as the material does not lose its insulating property.

The thickness of the tunnel blocking layer 153 is not restricted though a smaller thickness is preferable. For example, it is preferable to set the thickness of the layer 153 to 10 nm or less from the viewpoint of manufacturing a TMR device.

(Second Type)

FIG. 40B is a sectional view of a second-type TMR device.

The second-type TMR device is a TMR device referred to as double junction type.

As shown in FIG. 40B, the following layers are formed in order on the ground layer 150: an antiferromagnetic layer 151-1, ferromagnetic layer 152-1, tunnel blocking layer 153-1, ferromagnetic layer 154, tunnel blocking layer 153-2, ferromagnetic layer 152-2, antiferromagnetic layer 151-2, and protective layer 155.

In the case of this embodiment, the ferromagnetic layers 152-1 and 152-2 respectively function as a magnetized fixed layer and the ferromagnetic layer 154 functions as a magnetic recording layer. The antiferromagnetic layer 151-1 is a layer for fixing the spin direction of the ferromagnetic layer 152-1 and the antiferromagnetic layer 151-2 is a layer for fixing the spin direction of the ferromagnetic layer 152-2.

The double-junction TMR device of this embodiment has an advantage that it is possible to further increase the ratio between a resistance value at a low resistance and a resistance value at a high resistance, so-called the MR ratio (magnetoresistive effect ratio), compared to the case of the TMR device shown in FIG. 40A.

Materials of the antiferromagnetic layers 151-1 and 151-2, ferromagnetic layers 152-1, 152-2, and 154, and tunnel blocking layers 153-1 and 153-2 are already described for the above first type.

Thicknesses of the ferromagnetic layers 151-1, 151-2, and 54 are already described for the above first type.

Moreover, materials and thicknesses of the tunnel blocking layers 153-1 and 153-2 are already described for the above first type.

(Third Type)

FIG. 40C is a sectional view showing a third-type TMR device.

As shown in FIG. 40C, the third-type TMR device is obtained by forming the ferromagnetic layers 152 and 154 of the first-type TMR device into a stacked structure of a ferromagnetic layer and a nonmagnetic layer. The stacked structure uses a three-layer film of a ferromagnetic layer, nonmagnetic layer, and ferromagnetic layer like the case of this embodiment. In the case of this embodiment, the ferromagnetic layer 152 is formed by a three-layer film of a ferromagnetic layer 161, nonmagnetic layer 162, and ferromagnetic layer 163 and the ferromagnetic layer 154 is formed by a three-layer film of a ferromagnetic layer 164, nonmagnetic layer 165, and ferromagnetic layer 166.

Materials of the ferromagnetic layers 161, 163, 164, and 166 are already described for the above first type.

The nonmagnetic layers 162 and 165 can use one of the following materials.

Ru and Ir

The following films are specific examples of three-layer films respectively formed by a ferromagnetic layer, nonmagnetic layer, and ferromagnetic layer.

Co, Ru, and Co; Co, Ir, and Co

Co—Fe, Ru, and Co—Fe; Co—Fe, Ir, and Co—Fe

When forming the ferromagnetic layer 152 functioning as a magnetized fixed layer by a stacked structure, that is, forming the layer 152 by a three-layer film of the ferromagnetic layer 161, nonmagnetic layer 162, and ferromagnetic layer 163, it is preferable to generate an antiferromagnetic combination between the ferromagnetic layers 161 and 163 through the nonmagnetic layer 162. Moreover, the antiferromagnetic layer 151 is set so as to contact with the above three-layer film. By using the above structure, it is possible to obtain an advantage that the spin direction of the ferromagnetic layer 152 functioning as a magnetized fixed layer, particularly the spin direction of the ferromagnetic layer 163 can be more firmly fixed. According to the above advantage, the ferromagnetic layer 152, particularly the ferromagnetic layer 163 is not easily influenced by a galvanomagnetic field and it is possible to restrain the spin direction of the ferromagnetic layer 152 functioning as a magnetized fixed layer from being accidentally reversed.

Moreover, even when forming the ferromagnetic layer 154 functioning as a magnetic recording layer by a stacked structure, for example, by a three-layer film of the ferromagnetic layer 164, nonmagnetic layer 165, and ferromagnetic layer 166, it is preferable to generate antiferromagnetic combination between the ferromagnetic layers 164 and 166. In this case, because a magnetic flux closes in the three-layer film, it is possible to restrain increase of a switching magnetic field caused by a magnetic pole. As a result, it is possible to obtain an advantage that increase of the power consumption caused by a galvanomagnetic field due to, for example, a diamagnetic field can be prevented even if the size of a memory cell or TMR device is decreased to submicron or less.

Moreover, it is possible to form the ferromagnetic layer 154 functioning as a magnetic recording layer by a stacked structure of a soft ferromagnetic layer and a ferromagnetic layer. The soft ferromagnetic layer described here denotes a layer whose spin direction is easily reversed compared to the case of a ferromagnetic layer.

When forming the ferromagnetic layer 154 by a stacked structure of a soft ferromagnetic layer and a ferromagnetic layer, the soft ferromagnetic layer is set to a position closer to a galvanomagnetic-field wiring such as a bit line.

It is also possible to make the stacked structure further include a nonmagnetic layer. For example, in the case of a three-layer structure of the ferromagnetic layer 164, nonmagnetic layer 165, and ferromagnetic layer 166 like this embodiment, it is also possible to use a soft ferromagnetic layer as the ferromagnetic layer 166.

In the case of this embodiment, the ferromagnetic layers 152 and 154 are respectively formed by a stacked structure. However, it is also allowed to form only the ferromagnetic layer 152 or 154 by a stacked structure.

[Fourth Type]

FIG. 40D is a sectional view showing a fourth-type TMR device.

As shown in FIG. 40D, the fourth-type TMR device is constituted by respectively forming the ferromagnetic layers 152-1, 154, and 152-2 of the second-type TMR device by the stacked structure described for the third type.

In the case of this embodiment, the ferromagnetic layer 152-1 is formed by a three-layer film of a ferromagnetic layer 161-1, nonmagnetic layer 162-1, and ferromagnetic layer 163-1, the ferromagnetic layer 154 is formed by a three-layer film of a ferromagnetic layer 164, nonmagnetic film 165, and ferromagnetic layer 166, and the ferromagnetic layer 152-2 is formed by a three-layer film of a ferromagnetic layer 161-2, nonmagnetic layer 162-2, and ferromagnetic layer 163-2.

Materials of the ferromagnetic layers 161-1, 161-2, 163-1, 163-2, 164 and 166 are already described of for the above first type.

Materials of the nonmagnetic layers 162-1, 162-2, and 165 are already described for the above third type.

In the case of this embodiment, the ferromagnetic layers 152-1, 154, and 152-2 are respectively formed by a stacked structure. However, it is allowed to form at least only one layer by a stacked structure.

The magnetic random access memory (semiconductor memory device) according to the first to fifth embodiments of this invention can be applied to various devices. Some of the application examples are explained with reference to FIGS. 41 to 47.

APPLICATION EXAMPLE 1

Figure 41:
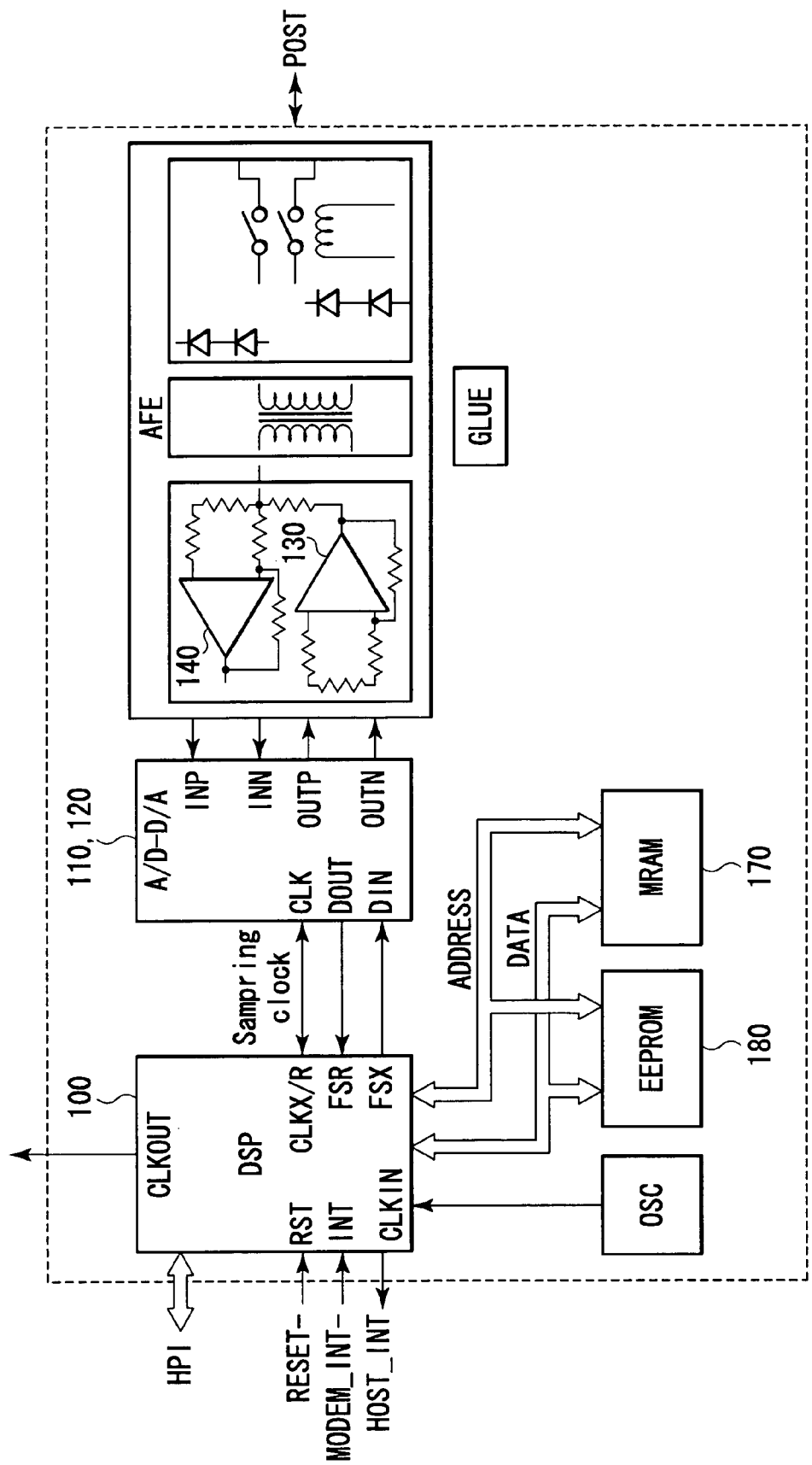
FIG. 41 is a block diagram showing a DSL data path of a modem for a digital subscriber's line (DSL), which explains an application example 1 of the MRAM used for first to eleventh embodiments of the present invention.

FIG. 41 shows an extracted DSL data path portion of a modem for digital subscriber lines (DSL). The modem includes a programmable digital signal processor (DSP) 100, analog/digital (A/D) converter 110, digital/analog (D/A) converter 120, transmission driver 150 and receiver amplifier 160. In FIG. 11, a band pass filter is omitted and a magnetic random access memory 170 and EEPROM 180 of this embodiment are shown as various types of optional memories used to hold a line code program (a program which permits a modem to be selected and operated according to coded subscriber line information and transfer condition (line code; OAM, CAP, RSK, FM, AM, PAM, DWMT and the like) performed by use of the DSP) instead of the band pass filter.

In the present example, two types of memories of the magnetic random access memory 170 and EEPROM 180 are used as a memory to hole the line code program. However, the EEPROM 180 can be replaced by a magnetic random access memory. That is, instead of using two types of memories, only the magnetic random access memory can be used.

APPLICATION EXAMPLE 2

Figure 42:
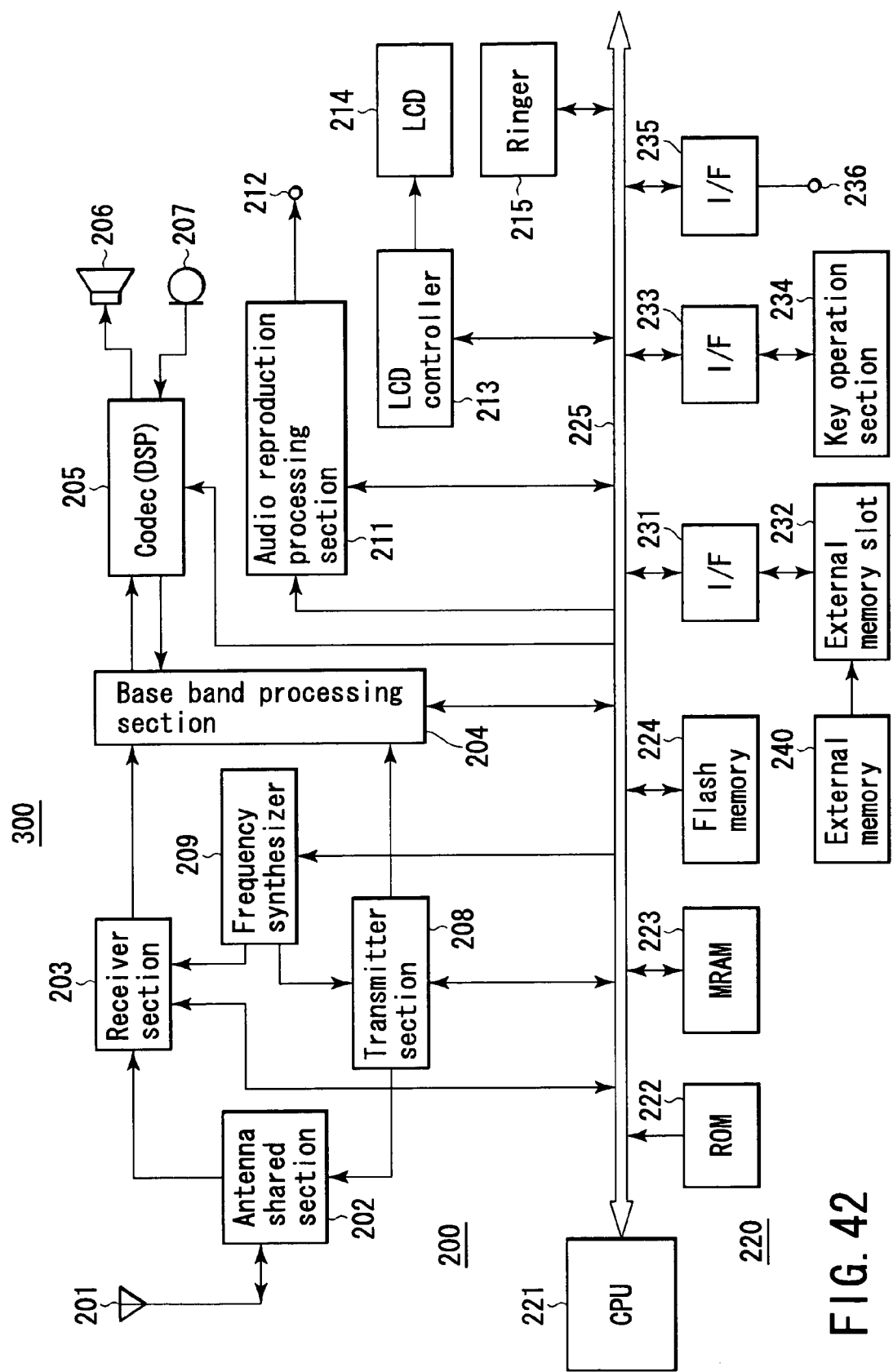
FIG. 42 is a block diagram showing a mobile telephone terminal, which explains an application example 2 of the MRAM used for first to eleventh embodiments of the present invention.
Figure 43:
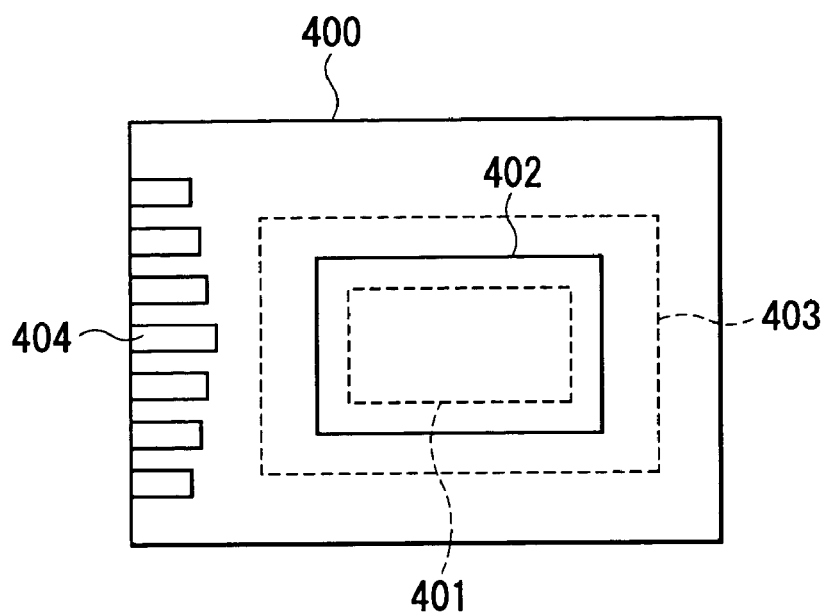
FIG. 43 is a top view showing a case of applying the MRAM used for first to eleventh embodiments of the present invention to a card (MRAM card) for storing media contents of smart media or the like, which explains an application example 3 of the MRAM.

FIG. 42 shows a portable telephone terminal 300 as another application example. A communication section 200 which realizes the communication function includes a transmission/reception antenna 201, antenna shared section 202, receiver section 203, base band processing section 204, DSP 205 used as a voice codec, speaker (receiver) 206, microphone (transmitter) 207, transmitter section 208 and frequency synthesizer 209.

Further, the portable telephone terminal 300 includes a control section 220 which controls various sections of the portable telephone terminal. The control section 220 is a microcomputer to which a CPU 221, ROM 222, a magnetic random access memory (MRAM) 223 of this embodiment and flash memory 224 are connected via a CPU bus 225. A program executed by the CPU 221 and necessary data for display fonts are previously stored in the ROM 222. The MRAM 223 is mainly used as a working area. It is used to store data obtained in the course of calculations as required while the CPU 221 is executing the program or temporarily store data transferred between the control section 220 and the other sections. Further, when the power supply of the portable telephone terminal 300 is turned OFF, it is desired in some cases to store the set condition obtained immediately before turn-OFF of the power supply and set the same condition when the power supply is next turned ON. For this purpose, the flash memory 224 is used to store set parameters associated with the set condition. Thus, if the power supply of the portable telephone terminal is turned OFF, there is no possibility that the stored set parameters will be lost.

Further, the portable telephone terminal 300 includes an audio reproduction processing section 211, external output terminal 212, LCD controller 213, LCD (liquid crystal display) 214 and a ringer 215 which generates a call sound. The audio reproduction processing section 211 reproduces audio information input to the portable telephone terminal 300 (or audio information stored in an external memory 240 which will be described later). The reproduced audio information is transmitted to a head phone or mobile speaker via the external output terminal 212 and thus can be output to the exterior. Thus, by providing the audio reproduction processing section 211, audio information can be reproduced. For example, the LCD controller 213 receives display information from the CPU 221 via the CPU bus 225, converts the display information into LCD control information used to control the LCD 214 and drives the LCD 214 for display.

In addition, the portable telephone terminal 300 includes interface circuits (I/F) 231, 233, 235, external memory 240, external memory slot 232, key operation section 234 and external input/output terminal 236. A memory card such as the external memory 240 is inserted into the external memory slot 232. The external memory slot 232 is connected to the CPU bus 225 via the interface circuit (I/F) 231. Thus, by providing the slot 232 in the portable telephone terminal 300, it becomes possible to write information in the internal portion of the portable telephone terminal 300 into the external memory 240 and input information (for example, audio information) stored in the external memory 240 to the portable telephone terminal 300. The key operation section 234 is connected to the CPU bus 225 via the interface circuit (I/F) 233. Key input information input from the key operation section 234 is transmitted to the CPU 221, for example. The external input/output terminal 236 is connected to the CPU bus 225 via the interface circuit (I/F) 235. Thus, the terminal 236 functions as a terminal which inputs various information items from the exterior to the portable telephone terminal 300 or outputs information from the portable telephone terminal 300 to the exterior.

In this application example, the ROM 222, RAM 223 and flash memory 224 are used, but it is possible to replace the flash memory 224 by a magnetic random access memory and further replace the ROM 222 by a magnetic random access memory.

APPLICATION EXAMPLE 3

FIGS. 43 to 47 show examples in which a magnetic random access memory is applied to cards (MRAM cards) which receive media contents such as smart media or the like.

An MRAM chip 401 is contained in an MRAM card body 400. An opening portion 402 corresponding in position to the MRAM chip 401 is formed in the card body 400 so as to expose the MRAM chip 401. A shutter 403 is provided on the opening portion 402 so that the MRAM chip 401 can be protected by the shutter 403 when the MRAM card is carried. The shutter 403 is formed of a material such as ceramic which has an effect of shielding external magnetic fields. When data is transferred, the shutter 403 is released to expose the MRAM chip 401. An external terminal 404 is used to output contents data stored in the MRAM card to the exterior.

Figure 44:
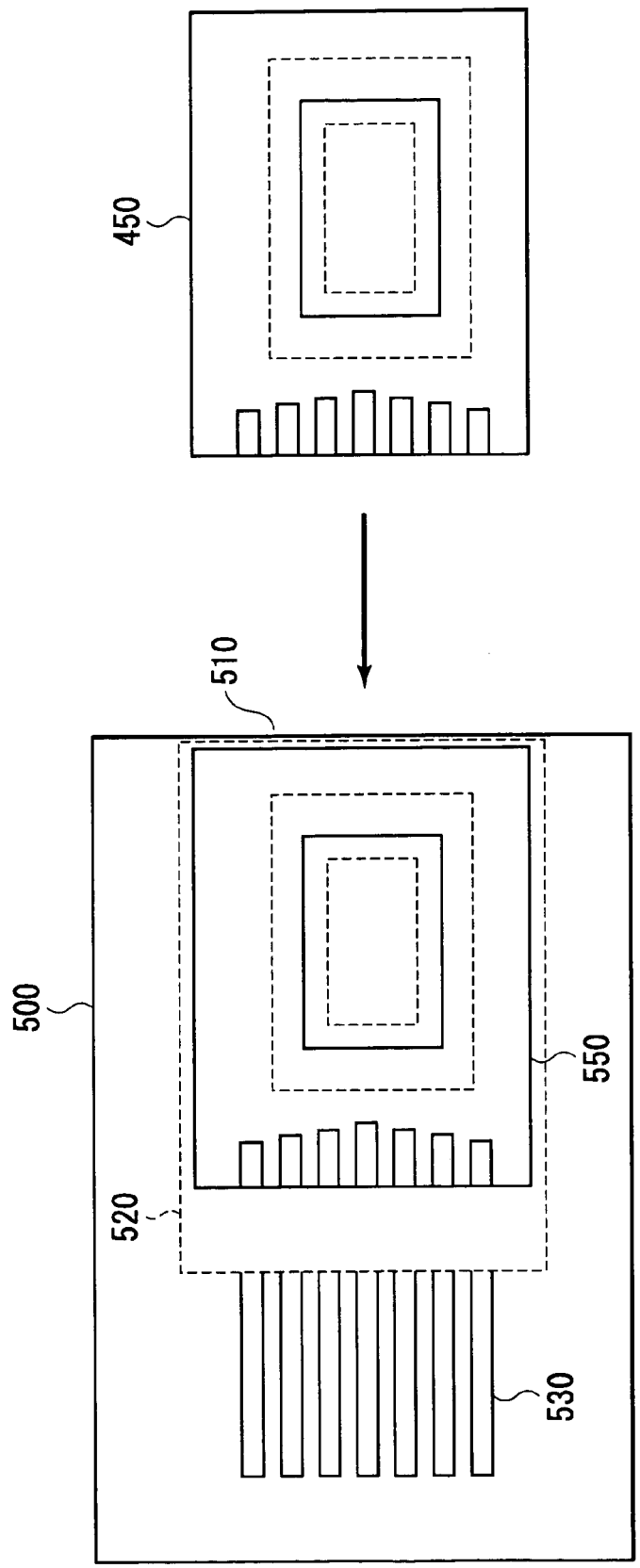
FIG. 44 is a top view showing a transfer system for transferring data to the MRAM card.
Figure 45:
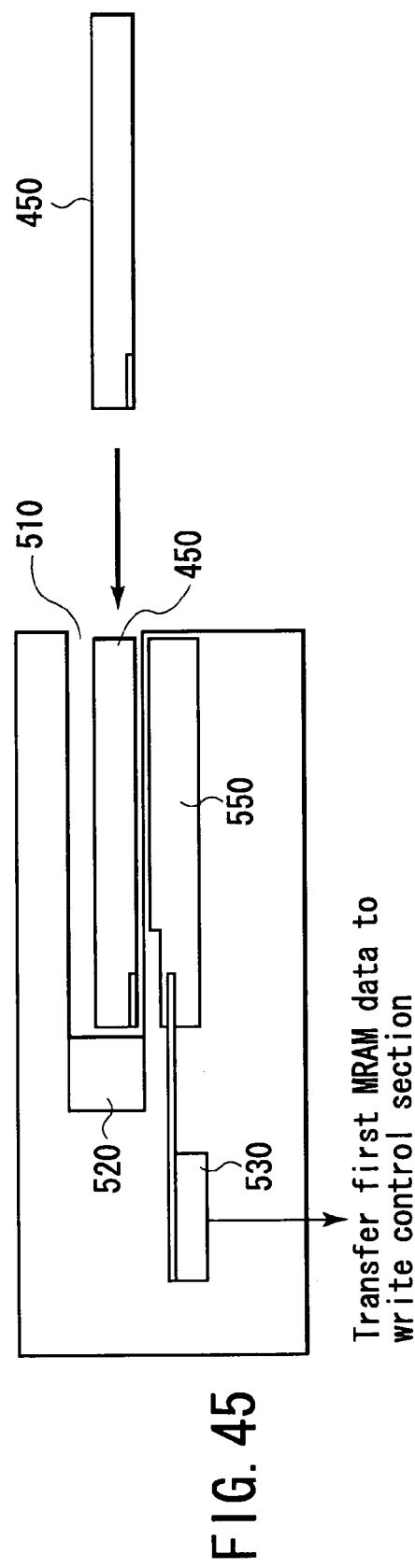
FIG. 45 is a sectional view showing a transfer system for transferring data to the MRAM card.

FIGS. 44 and 45 show a transfer device which transfers data to the MRAM card. FIG. 44 is a top plan view of a card insertion type transfer device and FIG. 45 is a cross-sectional view showing the transfer device. A second MRAM card 450 which an end user uses is inserted via an inserting portion 510 of a transfer device 500 as indicated by an arrow and pushed into the transfer device until it is stopped by a stopper 520. The stopper 520 also functions as a member which aligns the second MRAM card 450 with a first MRAM 550. When the second MRAM card 450 is placed in a preset position, a control signal is supplied from a first MRAM data rewriting control section to an external terminal 530. As a result, data stored in the first MRAM 550 is transferred to the second MRAM card 450.

Figure 46:
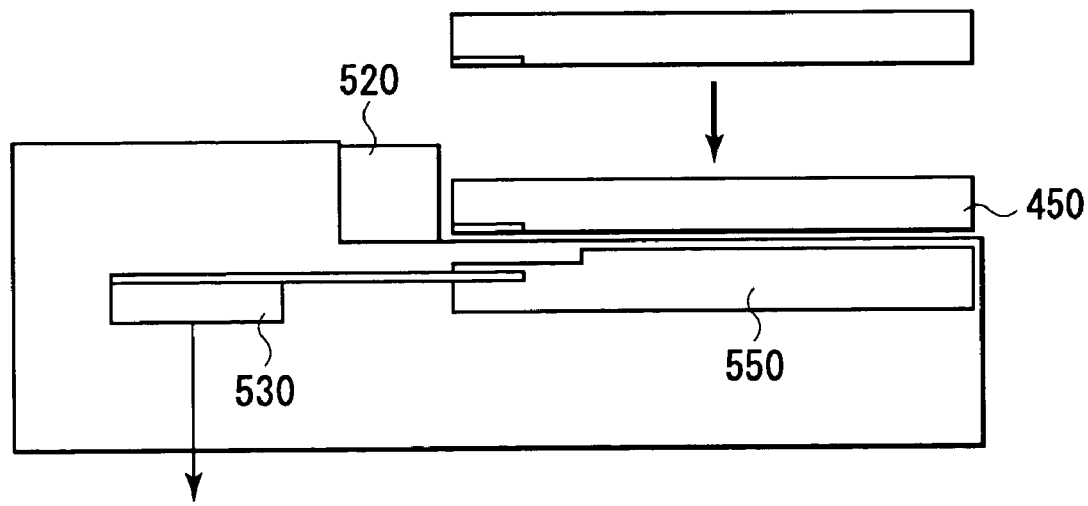
FIG. 46 is a sectional view showing a male-female transfer system for transferring data to the MRAM card.

FIG. 46 shows a fitting type transfer device. The transfer device is of a type in which the second MRAM card 450 is fitted into and mounted on the first MRAM 550 as indicated by an arrow with the stopper 520 used as a target. The data transfer method is the same as that of the card insertion type and the explanation thereof is omitted.

Figure 47:
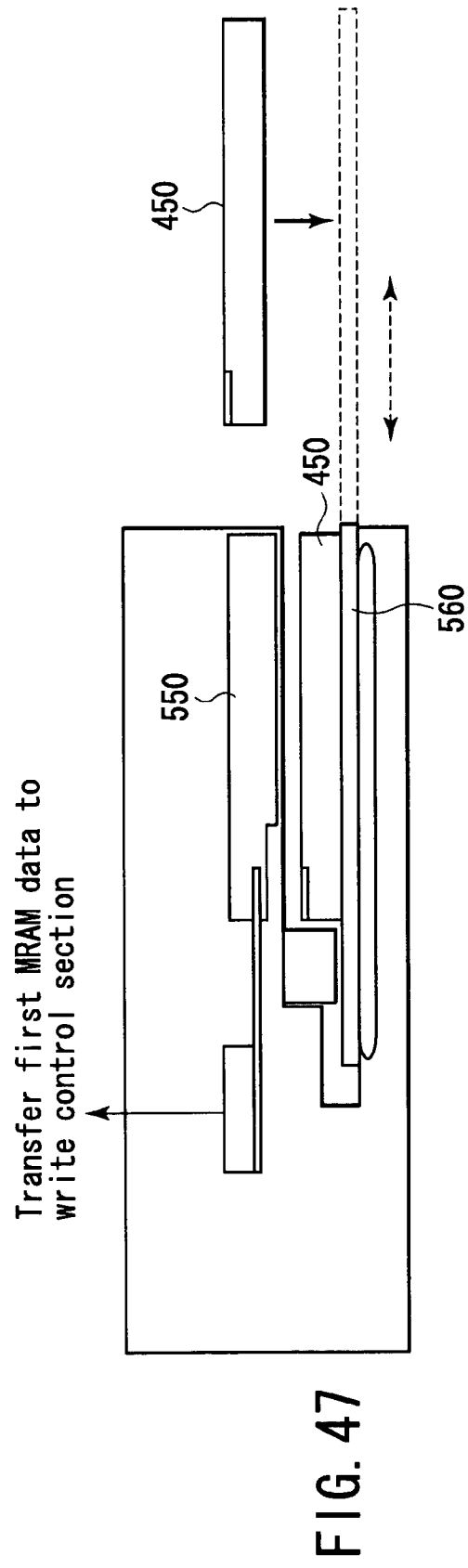
FIG. 47 is a sectional view showing a sliding transfer system for transferring data to the MRAM card.
Figure 48A:
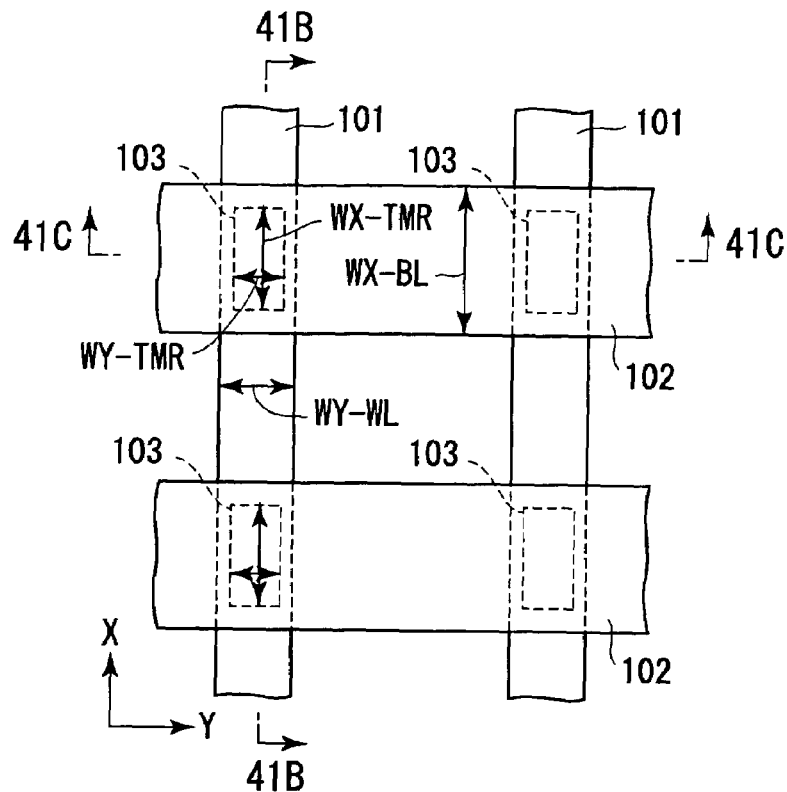
FIG. 48A is a top view showing a typical MRAM.
Figure 48B:
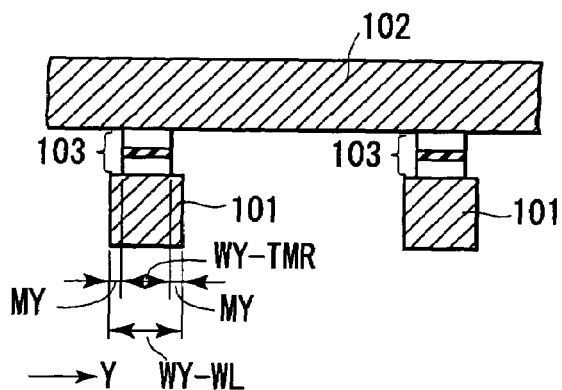
FIG. 48B is a sectional view taken along the line 48B—48B in FIG. 48A.
Figure 48C:
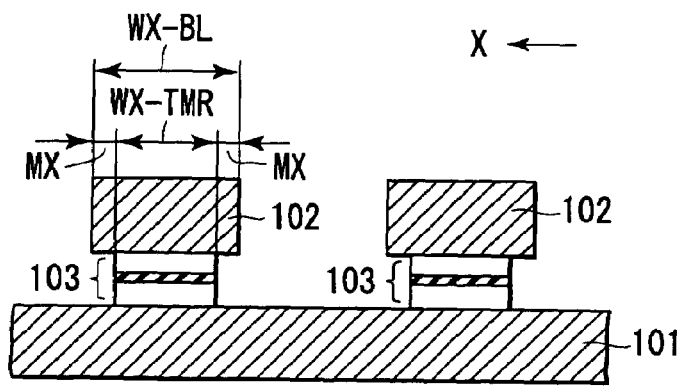
FIG. 48C is a sectional view taken along the line 48C—48C in FIG. 48A.
Figure 49A:
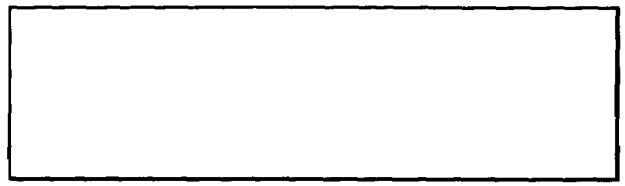
FIGS. 49A, 49B, and 49C are top views respectively showing the planar shape of a TMR device.
Figure 49B:
Figure 49C:

FIG. 47 shows a slide type transfer device. Like a CD-ROM driver or DVD driver, a transfer device 500 has a reception plate slide 560 and the reception plate slide 560 is moved in a direction as indicated by an arrow. When the reception plate slide 560 is moved to a position indicated by broken lines, the second MRAM card 450 is placed on the reception plate slide 560 and then inserted into the transfer device 500. The fact that the second MRAM 450 is inserted and the front end portion thereof abuts against the stopper 520 and the data transfer method are the same as those of the card insertion type and the explanation thereof is omitted.

Though the present invention is described above in accordance with the first to fifth embodiments, the present invention is not restricted to these embodiments. The present invention can be variously modified as long as modifications are not deviated from the gist of the present invention.

Moreover, though the first to fifth embodiments can be independently executed, it is a matter of course that they can be executed by combining them.

Furthermore, because inventions at various stages are included in the above first to fifth embodiments, it is possible to extract inventions at various stages by properly combining a plurality of constituents disclosed for each embodiment.

Furthermore, the above first to fifth embodiments are respectively described in accordance with a case of applying the present invention to a magnetic random access memory. However, semiconductor integrated circuit devices respectively including the above magnetic random access memory such as a processor and system LSI are included in the category of the present invention.

As described above, according to the first to fifth embodiments, it is possible to restrain the rise of a magnetized inverted threshold value from rising and the fluctuation band of the magnetized inverted threshold value from expanding and moreover, it is possible to provide a semiconductor integrated circuit device having a TMR device which can be further fined and its manufacturing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a first wiring extending in a first direction;
   a second wiring extending in a second direction crossing the first direction; and a magnetoresistive effect device including a first magnetic layer, nonmagnetic layer, and second magnetic layer, wherein the planar shape of the magnetoresistive effect device coincides with the planar shape of the crossing portion between the first wiring and the second wiring a third wiring extending in the second direction and formed in parallel with the second wiring through a gap, wherein the contact with the first wiring is present on the lower face of the magnetoresistive effect device and the contact with the third wiring is present on the upper face of the magnetoresistive effect device.

2. The device according to claim 1, wherein a contact with the first wiring is present on the lower face of the magnetoresistive effect device and a contact with the second wiring is present on the upper face of the magnetoresistive effect device.

3. The device according to claim 1, wherein the magnetoresistive effect device is stacked with a rectifying device.

4. The device according to claim 1, wherein a contact with the first wiring is present on the lower face of the magnetoresistive effect device and the upper face of the magnetoresistive effect device connects with one end of a lead electrode and the other end of the lead electrode connects with the source or drain diffusion layer of a MOSFET.

5. A semiconductor integrated circuit device comprising:
   a first wiring extending in a first direction;
   a second wiring extending in a second direction crossing the first direction; and
   a magnetoresistive effect device including a first magnetic layer, nonmagnetic layer, and second magnetic layer, wherein the magnetoresistive effect device is a magnetoresistive effect device constituted by a magnetic recording layer including a magnetic layer, a tunnel blocking layer including a nonmagnetic layer, and a magnetized fixed layer including a magnetic layer, wherein the planar shape of the magnetic recording layer coincides with the planar shape of the crossing portion between the first wiring and the second wiring and the planar shape of the magnetized fixed layer coincides with the planar shape of the first wiring.

6. A method of manufacturing a semiconductor integrated circuit device, comprising:
   forming a first insulating layer on a semiconductor substrate;
   forming a first conductive layer on the first insulating layer;
   forming a magnetoresistive effect device layer including at least a first magnetic layer, nonmagnetic layer, and second magnetic layer on the first conductive layer;
   working the magnetoresistive effect device layer and the first conductive layer by using a mask having a pattern corresponding to a first wiring pattern;
   forming a second insulating layer on the worked magnetoresistive effect device layer and the first insulating layer;
   planarizing the second insulating layer so that the upper face of the second insulating layer and the upper face of the magnetoresistive effect device layer are exposed on the same plane;
   forming a second conductive layer on the second insulating layer and the TMR layer;
   forming a third insulating layer on the second conductive layer;
   forming a third conductive layer on the third insulating layer; and
   working the third conductive layer, the third insulating layer, the second conductive layer, and the magnetoresistive effect device layer by using a mask having a pattern corresponding to a second wiring pattern.

7. The method according to claim 6, wherein when working the magnetoresistive effect device layer, only either of the first magnetic layer and the second magnetic layer is worked to stop working at the nonmagnetic layer.

8. The method according to claim 7, wherein the magnetoresistive effect device layer is a TMR layer including a magnetic recording layer, tunnel blocking layer, and magnetized fixed layer and when working the magnetoresistive effect device layer, the magnetic recording layer is worked and working is stopped at the tunnel blocking layer.

9. A method of manufacturing a semiconductor integrated circuit device, comprising:
   forming a first insulating layer on a semiconductor substrate;
   forming a first conductive layer on the first insulating layer;
   forming a composite layer including a rectifying device layer and a magnetoresistive effect device layer formed by at least a first magnetic layer, nonmagnetic layer, and second magnetic layer on the first conductive layer;
   working the composite layer and the first conductive layer by using a mask having a pattern corresponding to a first wiring pattern;
   forming a second insulating layer on the worked composite layer and the first insulating layer;
   planarizing the second insulating layer so that the upper face of the second insulating layer and the upper face of the composite layer are exposed on the same plane;
   forming a second conductive layer on the second insulating layer and the magnetoresistive effect device layer;
   forming a third insulating layer on the second conductive layer;
   forming a third conductive layer on the third insulating layer; and
   working the third conductive layer, the third insulating layer, the second conductive layer, and the composite layer by using a mask having a pattern corresponding to a second wiring pattern.

10. The method according to claim 9, wherein when working the composite layer, only either of the first magnetic layer and the second magnetic layer is worked to stop working at the nonmagnetic layer.

11. The method according to claim 10, wherein the magnetoresistive effect device layer included in the composite layer is a TMR including a magnetic recording layer, tunnel blocking layer, and magnetized fixed layer and when working the magnetoresistive effect device layer, the magnetic recording layer is worked to stop working at the tunnel blocking layer.

12. A method of manufacturing a semiconductor integrated circuit device, comprising:
   forming a first insulating layer on a semiconductor substrate on which an insulating-gate-type field-effect transistor is formed;
   planarizing the first insulating layer;
   forming a first conductive layer on the first insulating layer;
   forming a magnetoresistive effect device layer including at least a first magnetic layer, nonmagnetic layer, and second magnetic layer on the first conductively layer;

working the magnetoresistive effect device layer and the first conductive layer by using a mask having a pattern corresponding to a first wiring pattern;

forming a second insulating layer on the worked magnetoresistive effect device layer and the first insulating layer;

planarizing the second insulating layer so that the upper face of the second insulating layer and the upper face of the magnetoresistive effect device layer are exposed on the same plane;

forming a via to be electrically connected to the source or drain of the insulating-gate-type field-effect transistor by penetrating the second insulating layer and the first insulating layer;

forming a second conductive layer on the second insulating layer and the magnetoresistive effect device layer;

working the second conductive layer into a pattern contacting with the magnetoresistive effect device and the via;

forming a third insulating layer on the worked second conductive layer and the second insulating layer;

forming a third conductive layer on the third insulating layer; and working the third conductive layer, the third insulating layer, the second conductive layer, and the magnetoresistive effect device layer by using a mask having a pattern corresponding to a second wiring pattern.

13. The method according to claim 12, wherein when working the magnetoresistive effect device layer, only either of the first magnetic layer and the second magnetic layer is worked to stop working at the nonmagnetic layer.

14. The method according to claim 13, wherein the magnetoresistive effect device layer is a TMR layer including a magnetic recording layer, tunnel blocking layer, and magnetized fixed layer and when working the magnetoresistive effect device layer, the magnetic recording layer is worked and working is stopped at the tunnel blocking layer.

* * * * *